United States Patent
Kuboi et al.

(10) Patent No.: US 10,534,355 B2
(45) Date of Patent: Jan. 14, 2020

(54) INFORMATION PROCESSING DEVICE, PROCESSING DEVICE, PREDICTION METHOD, AND PROCESSING METHOD

(71) Applicant: SONY SEMICONDUCTOR SOLUTIONS CORPORATION, Kanagawa (JP)

(72) Inventors: Nobuyuki Kuboi, Kanagawa (JP); Takashi Kinoshita, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 225 days.

(21) Appl. No.: 15/548,005

(22) PCT Filed: Jan. 8, 2016

(86) PCT No.: PCT/JP2016/050430
§ 371 (c)(1),
(2) Date: Aug. 1, 2017

(87) PCT Pub. No.: WO2016/132759
PCT Pub. Date: Aug. 25, 2016

(65) Prior Publication Data
US 2018/0025951 A1    Jan. 25, 2018

(30) Foreign Application Priority Data
Feb. 20, 2015 (JP) .................. 2015-032229

(51) Int. Cl.
*G05B 19/418* (2006.01)
*H01L 21/3065* (2006.01)
(Continued)

(52) U.S. Cl.
CPC .... *G05B 19/41885* (2013.01); *H01L 21/3065* (2013.01); *H01L 22/20* (2013.01); *H01L 21/268* (2013.01)

(58) Field of Classification Search
CPC . H01L 22/20; H01L 21/2253; H01L 21/3065; H01L 21/32137; H01L 21/268;
(Continued)

(56) References Cited

U.S. PATENT DOCUMENTS 5,819,073 A * 10/1998 Nakamura .............. G06F 17/16
703/2
6,909,930 B2 * 6/2005 Shishido ........... H01L 21/67276
250/492.2

(Continued)

FOREIGN PATENT DOCUMENTS

EP    2549523 A1    1/2013
EP    2685489 A1    1/2014
(Continued)

OTHER PUBLICATIONS

Wang, et al., "High Energy Electron Fluxes in DC-Augmented Capacitively Coupled Plasmas. II. Effects on Twisting in High Aspect Ratio Etching of Dielectrics", Journal of Applied Physics 107, 023309, 2010, 11 pages.

(Continued)

*Primary Examiner* — Naum Levin
(74) *Attorney, Agent, or Firm* — Chip Law Group

(57) ABSTRACT

Efficiency of prediction of a physical quantity increases in repeated simulation of an etching process with a change of parameters. An information processing device includes a base shape storage unit and a physical quantity prediction unit. The base shape storage unit of the information processing device stores a shape of a sample etched within a chamber as a base shape. On the other hand, the physical
(Continued)

quantity prediction unit of the information processing device predicts a physical quantity within the chamber on the basis of a processing condition determined for the sample and associated with the physical quantity and the base shape.

12 Claims, 19 Drawing Sheets

(51) Int. Cl.
  *H01L 21/66* (2006.01)
  *H01L 21/268* (2006.01)
(58) Field of Classification Search
  CPC .......... G06F 17/5068; G05B 19/41885; G05B 2219/45031; Y02P 90/02; H05H 2245/123
  See application file for complete search history.

(56) References Cited

U.S. PATENT DOCUMENTS

| | | | | |
|---|---|---|---|---|
| 7,414,292 | B2* | 8/2008 | Ema | H01L 21/823857 257/369 |
| 7,776,697 | B2* | 8/2010 | Currie | H01L 29/105 438/285 |
| 7,872,242 | B2* | 1/2011 | Boswell | H01J 27/024 250/396 R |
| 8,545,710 | B2* | 10/2013 | Kuboi | C23C 14/48 216/59 |
| 8,918,198 | B2* | 12/2014 | Atanasoff | G01B 11/0625 700/104 |
| 9,189,577 | B2* | 11/2015 | Kuboi | G06F 17/5009 |
| 9,620,338 | B2* | 4/2017 | Samukawa | G01N 21/67 |
| 9,915,614 | B2* | 3/2018 | Chou | B03C 5/026 |
| 2013/0013253 | A1 | 1/2013 | Samukawa et al. | |
| 2014/0005990 | A1* | 1/2014 | Kuboi | G06F 17/5009 703/2 |
| 2014/0005991 | A1 | 1/2014 | Ono et al. | |

FOREIGN PATENT DOCUMENTS

| | | |
|---|---|---|
| JP | 2000-150607 A | 5/2000 |
| JP | 2006-324682 A | 11/2006 |
| JP | 2012-186394 A | 9/2012 |
| KR | 10-2012-0139802 A | 12/2012 |
| KR | 10-2014-0016924 A | 2/2014 |
| TW | 201142914 A | 12/2011 |
| TW | 201239983 A | 10/2012 |
| WO | 2011/115023 A | 9/2011 |
| WO | 2011/115023 A1 | 9/2011 |
| WO | 2012/121081 A1 | 9/2012 |

OTHER PUBLICATIONS

International Search Report and Written Opinion of PCT Application No. PCT/JP2016/050430, dated Mar. 22, 2016, 02 pages of English Translation and 10 pages of ISRWO.

* cited by examiner

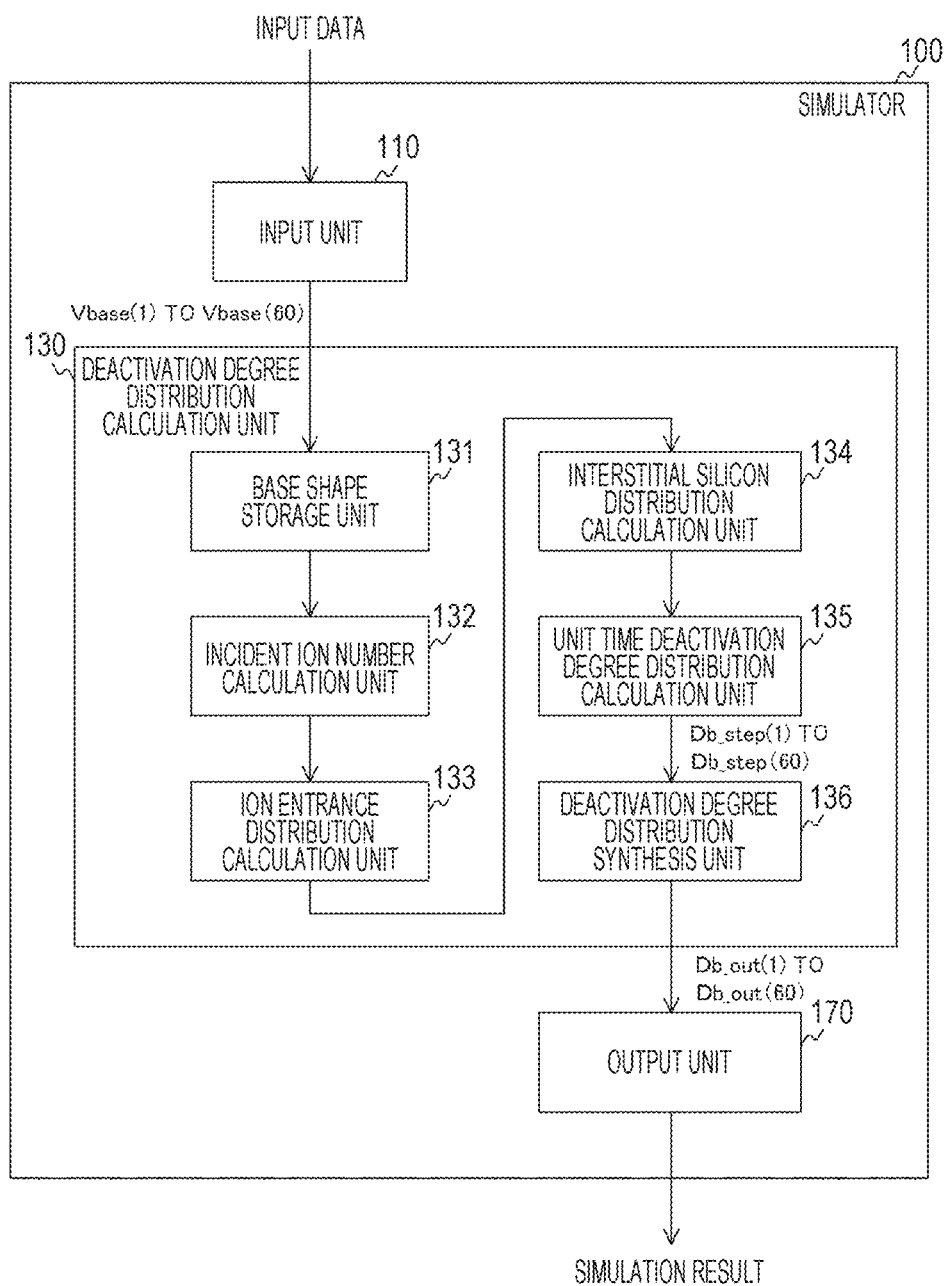

INFORMATION PROCESSING DEVICE, PROCESSING DEVICE, PREDICTION METHOD, AND PROCESSING METHOD

This application is a U.S. National Phase of International Patent Application No. PCT/JP2016/050430 filed on Jan. 8, 2016, which claims priority benefit of Japanese Patent Application No. JP 2015-032229 filed in the Japan Patent Office on Feb. 20, 2015. Each of the above-referenced applications is hereby incorporated herein by reference in its entirety.

TECHNICAL FIELD

The present technology relates to an information processing device, a processing device, a prediction method, a program, and a processing method. More specifically, the present technology relates to an information processing device, a processing device, a prediction method, a program under which a computer executes the prediction method, and a processing method, the respective devices, program, and methods predicting a physical quantity variable in an etching process.

BACKGROUND ART

It has been a demand, in recent years, to develop high-performance and low-cost semiconductor devices. For meeting this demand, accuracy of manufacturing process technologies for semiconductors is under improvement. Plasma etching is one of these manufacturing process technologies. According to plasma etching, processing shape dimensions, and quantitative prediction of crystal defect quantities caused by ion bombardment during processing (so-called damage quantities) are considered as important factors. For predicting the processing dimension shapes, a charging effect needs to be taken into consideration. The charging effect herein refers to generation of a potential distribution in the vicinity of a pattern surface in accordance with distribution differences of ions and electrons entering the processing pattern surface. This potential distribution varies transportation loci of ions and electrons, wherefore a side shape or the like gradually varies with development of processing. This varying effect of the side shape or the like in accordance with the variations of the loci of ions or the like is called a perturbation effect. The perturbation effect becomes particularly remarkable in fine transistor gate processing, or pattern processing at a high aspect ratio (i.e., narrow and deep pattern processing). Accordingly, shape or damage prediction considering the charging effect is regarded as an important factor in these types of processing.

There has been proposed a simulator which utilizes Monte Carlo method to predict the shape or damage in consideration of the foregoing charging effect (for example, see Non-patent Document 1). This simulator initially calculates transportation loci of ions and electrons by using Monte Carlo method to obtain a density distribution of ions and electrons. Subsequently, the simulator solves a Poisson equation on the basis of the obtained density distribution to derive a potential distribution on a pattern surface. Thereafter, the simulator again obtains transportation loci of ions and electrons under an effect of the potential distribution to obtain ion and electron densities on the pattern surface, and calculates an etch rate from the obtained ion and electron densities to predict a shape variation. In addition, a damage distribution caused by ultraviolet light, a variation of impurity concentrations, and others are also predicted as well as the shape variation. These procedures are repeated for each unit time until an etching end time to simulate an etching process.

CITATION LIST

Non-Patent Document

Non-Patent Document 1: Mingmei Wang, et al., High energy electron fluxes in dc-augmented capacitively coupled plasmas. II. Effects on twisting in high aspect ratio etching of dielectrics, Journal of Applied Physics 107, 023309 (2010)

SUMMARY OF THE INVENTION

Problems to be Solved by the Invention

According to the conventional technology described above, parameters included in the simulation may need to be changed for a design change or optimization. The parameters subjected to change may be electrode bias power, a wavelength of ultraviolet light generated during etching, a wafer temperature, and a generation rate or a diffusion coefficient of interstitial silicon resulting from ion bombardment, for example. With a change of these parameters, a prediction result of a physical quantity, such as an electric field distribution, a damage distribution caused by ultraviolet light, and impurity concentrations, is variable accordingly. The foregoing calculation flow therefore needs to re-start for every change of the parameters. In this case, the simulation period increases, and the device development cost rises. Accordingly, efficiency of prediction of a physical quantity may lower if simulation of the etching process is repeatedly performed with a change of parameters.

The present technology has been developed in consideration of the aforementioned circumstances. It is an object of the present technology to increase efficiency of prediction of a physical quantity in case of repeated simulation of an etching process with a change of parameters.

Solutions to Problems

The present technology has been developed to solve the aforementioned problems. A first aspect of the present technology is directed to an information processing device, a physical quantity prediction method, and a program under which a computer executes this method, the device including: a base shape storage unit that stores a shape of a sample etched within a chamber as a base shape; and a physical quantity prediction unit that predicts a physical quantity within the chamber on the basis of a processing condition determined for the sample and associated with the physical quantity and the base shape. With this arrangement, the physical quantity is predictable based on the processing condition and the base shape.

In addition, the physical quantity prediction unit of the first aspect may predict an electric field distribution within the chamber as the physical quantity. With this arrangement, the electric field distribution is predictable.

In addition, the processing condition of the first aspect may include at least one of electrode bias power that produces the electric field distribution, and of a flux amount and a flux vector of a particle within the chamber. With this arrangement, the electric field distribution is predictable based on at least one of the bias power, the flux amount, and the flux vector.

In addition, in the first aspect, there may be further provided a perturbation shape prediction unit that predicts, on the basis of the electric field distribution, a perturbation shape that is a shape of the sample etched in a side direction different from a depth direction perpendicular to a surface of the sample. With this arrangement, the perturbation shape is predictable.

In addition, the sample of the first aspect may be a semiconductor that contains an impurity. The physical quantity prediction unit of the first aspect may predict a distribution of a deactivation degree that indicates a drop degree of a concentration of the impurity from an initial value of the concentration. With this arrangement, the distribution of the deactivation degree is predictable.

In addition, the sample of the first aspect may be a semiconductor that contains an impurity. The processing condition of the first aspect may include at least one of a generation rate of interstitial silicon generated by ion bombardment, a diffusion coefficient of the interstitial silicon, and activation energy and a wafer temperature necessary for reaction between the interstitial silicon and the impurity. With this arrangement, the distribution of the deactivation degree is predictable based on a least one of the generation rate, the diffusion coefficient, the activation energy, and the wafer temperature.

In addition, the physical quantity prediction unit of the first aspect may predict a distribution of a damage amount of the sample produced by ultraviolet light generated within the chamber as the physical quantity. With this arrangement, the distribution of the damage amount produced by the ultraviolet light is predictable.

In addition, the processing condition of the first aspect may include at least one of a wavelength of the ultraviolet light and an intensity of the ultraviolet light. With this arrangement, the distribution of the damage amount produced by the ultraviolet light is predictable based on the wavelength and intensity of the ultraviolet light.

In addition, the base shape storage unit of the first aspect may store the base shape for each unit time. The physical quantity prediction unit of the first aspect may predict, for each unit time, the physical quantity on the basis of the base shape and the processing shape for the corresponding unit time. With this arrangement, the physical quantity is predictable for each unit time.

In addition, in the first aspect, there may be further provided a base shape prediction unit that predicts the base shape and retains the base shape in the base shape storage unit. With this arrangement, the base shape is predictable.

In addition, a second aspect of the present technology is directed to a processing device and a processing method for the device, the processing device including: abase shape storage unit that stores a shape of a sample etched within a chamber as abase shape; a physical quantity prediction unit that predicts a physical quantity within the chamber on the basis of a processing condition determined for the sample and associated with the physical quantity and the base shape; a processing unit that processes the sample on the basis of the processing condition; and a control unit that changes the processing condition on the basis of the predicted physical quantity, and supplies the changed processing condition to the processing unit as a new processing condition. With this arrangement, the physical quantity is predictable based on the processing condition and the base shape.

Effects of the Invention

Offered according to the present technology is an excellent advantageous effect for realizing efficient prediction of a physical quantity in case of repeated simulation of an etching process with a change of parameters. Note that advantages to be offered are not limited to the aforementioned advantage, but may be any of advantages described in the present disclosure.

BRIEF DESCRIPTION OF DRAWINGS

FIG. 6 is a block diagram showing a configuration example of a simulator according to a second embodiment.

MODES FOR CARRYING OUT THE INVENTION

Modes for carrying out the present technology (hereinafter referred to as embodiments) are described hereinbelow. The description is presented in the following order.

1. First embodiment (example of prediction of electric field distribution from base shape)

2. Second embodiment (example of prediction of deactivation degree distribution from base shape)

3. Third embodiment (example of prediction of ultraviolet damage distribution from base shape)

4. Fourth embodiment (example of prediction of base shape and prediction of electric field distribution)

5. Fifth embodiment (example of prediction of electric field distribution from base shape, and processing)

1. <First Embodiment>

[Configuration Example of Simulator]

Figure 1:
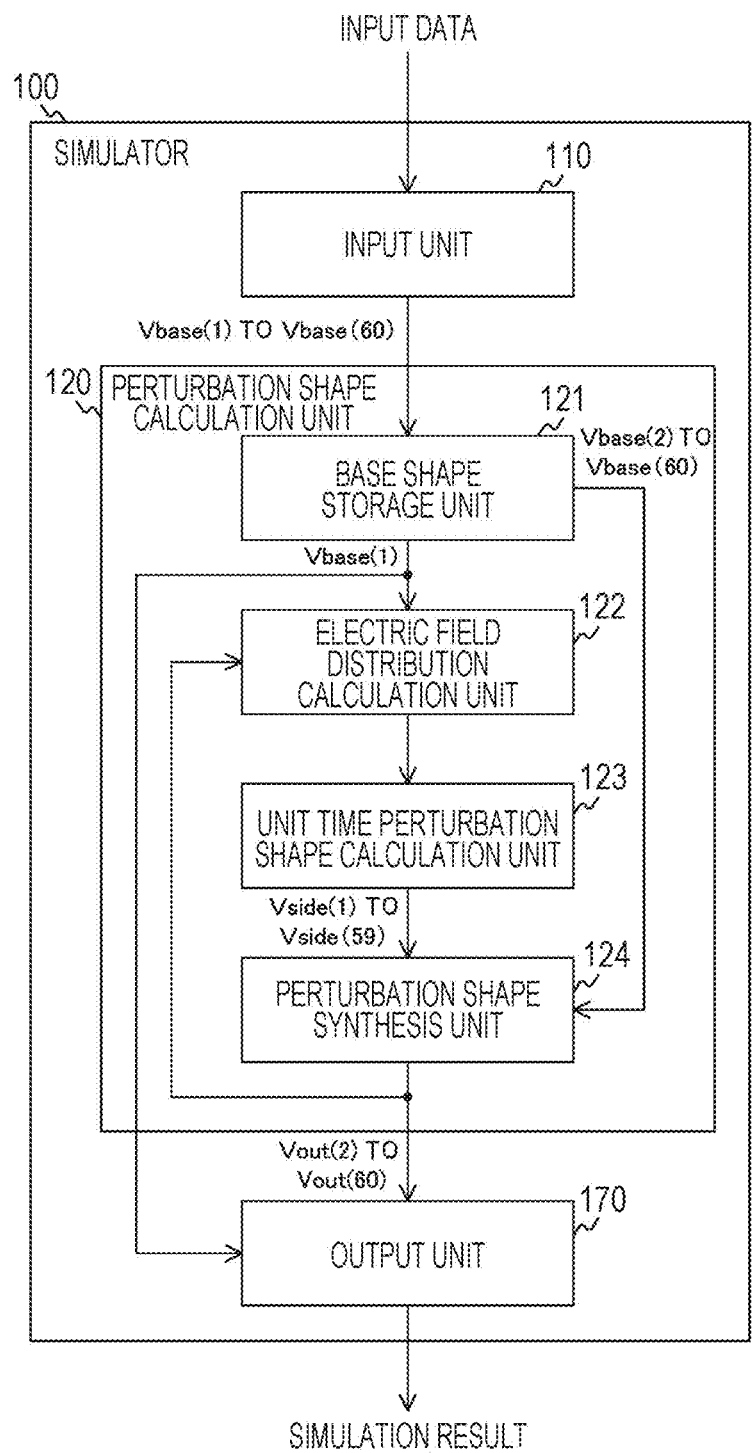
FIG. 1 is a block diagram showing a configuration example of a simulator according to a first embodiment.

FIG. 1 is a block diagram showing a configuration example of a simulator 100 according to a first embodiment. The simulator 100 is a device which predicts a shape of a sample etched by plasma, for example, and includes an input unit 110, a perturbation shape calculation unit 120, and output unit 170. The perturbation shape calculation unit 120 includes a base shape storage unit 121, an electric field distribution calculation unit 122, a unit time perturbation shape calculation unit 123, and a perturbation shape synthesis unit 124. Note that the simulator 100 is an example of an information processing device according to the appended claims.

An operation system (OS) of the simulator 100 may be selected from Windows (registered trademark), Linux (registered trademark), Unix (registered trademark), and Macintosh (registered trademark). In addition, a programming language of the simulator 100 may be selected from C/C++ (registered trademark), Fotran, JAVA (registered trademark) and others.

The input unit 110 is a unit through which input data necessary for simulation of plasma etching is input to the perturbation shape calculation unit 120 via graphical user interface (GUI) or the like. For example, various types of parameters indicating processing conditions, and base shape data are input as input data.

The base shape data in this context is data which indicates, as abase shape, a shape of a sample not subjected to a charging effect. Suppose that plasma etching is performed for a sample of which surface is covered with a resist mask which has a rectangular aperture having a side length of A (A: real number) nanometers (nm), for example. At an etching rate of B (B: real number) nanometers per second (nm/s), a recess to be formed in the sample after an elapse of one second from an etching start has a rectangular bottom having a side length of A nanometers, and four rectangular sides each of which has a size of A×B nanometers. A cross-sectional shape, or a solid shape of the sample having this recess is input as a base shape. In practical etching, the sides of the sample are processed into complicated shapes in accordance with variations of loci of particles caused by a charging effect, as described above. However, variations of the perturbation shape caused by the charging effect are not reflected in the base shape data. Accordingly, the sides in the data are handled as flat surfaces or curved surfaces extending substantially in parallel with each other in the depth direction, and having no recesses or protrusions.

The base shape data described above is calculated beforehand prior to a start of simulation, and input as data indicating the base shape. For example, the base shape data includes a base shape for each unit time of an etching period. For example, the base shape data includes base shapes Vbase (1) through Vbase (S). In this case, S is a value (e.g. "60") obtained by dividing the etching period (e.g. 60 seconds) by the unit time (e.g. one second), while Vbase (s) indicates a base shape at a time after an elapse of s (s: integer from 1 to S)×(unit time) from an etching start. For example, each of the base shapes Vbase (s) includes coordinates of a plurality of voxels, and attributes of the voxels. Each of the voxels is a volume element, and constituted by a cube or the like. Each of the attributes indicates a type of substance existing in a voxel. An attribute set for each voxel is silicon, air, a resist mask or the like.

Note that, while the simulator 100 predicts development of the base shape by using a voxel method, this development may be predicted by using a string method or a level set method. In addition, the dimension of calculation may be either two dimension or three dimension.

On the other hand, the parameters of processing conditions indicate electrode bias power, a flux amount of ions, and parameters contained in etching characteristic data. The etching characteristic data prepared for each voxel contains a solid angle, incident energy of ions, flux vectors, a protection film thickness, an etch rate vector, and a damage amount caused by ion bombardment, for example. The flux vectors in this context are vectors indicating fluxes of ions, electrons, and radicals, for example. The solid angle is a three-dimensional angle of each voxel expected to form a pattern aperture.

The base shape storage unit 121 stores base shape data and parameters. Note that the base shape storage unit 121 is an example of a base shape storage unit according to the appended claims.

The electric field distribution calculation unit 122 predicts an electric field distribution by calculation as a physical quantity within a chamber. The electric field distribution calculation unit 122 initially reads the initial base shape Vbase (1) and a flux vector corresponding to this base shape from the base shape storage unit 121, and calculates a potential distribution by using a following Poisson equation.

[Mathematical Formula 1]

$$\Delta \Phi = -\frac{e}{\varepsilon_0}(n_i - n_e) \quad \text{Equation 1}$$

In the above equation, φ indicates a potential distribution. The left side represents a potential gradient obtained by second order differential of the potential distribution at a position (x, y). In this case, y is a coordinate in the depth direction, while x is a coordinate in a direction perpendicular to the depth direction. In addition, e of the right side represents an elementary charge, while epsilon represents a dielectric constant. Furthermore, $n_i$ represents an ion density within a voxel, while $n_e$ represents an electron density within a voxel.

Then, the electric field distribution calculation unit 122 predicts an electric field distribution E based on the obtained potential distribution by using a following equation, and supplies the electric field distribution E to the unit time perturbation shape calculation unit 123. Note that the electric field distribution calculation unit 122 is an example of a physical quantity prediction unit according to the appended claims.

[Mathematical Formula 2]

$$E = -\nabla \Phi \quad \text{Equation 2}$$

The unit time perturbation shape calculation unit 123 predicts a perturbation shape by calculation. The unit time perturbation shape calculation unit 123 solves following equations to obtain loci of respective test ions which have incident energy input from the input unit 110 and enter the sample from a position immediately above the pattern of the resist mask under the electric field distribution E. Calculation is performed on the assumption that a predetermined number (e.g. 20) of the test ions enter the sample. A locus is obtained for each test ion by solving an equation of motion.

$$dv_x/dt = eE_x/m \quad \text{Equation 3}$$

$$dv_y/dt = eE_y/m \quad \text{Equation 4}$$

In Equations 3 and 4, $v_x$ is an ion speed in the x direction, while $v_y$ is an ion speed in the y direction. These speeds are expressed in meters per second (m/s), for example. In addition, $E_x$ is an electric field distribution in the x direction, while $E_y$ is an electric field distribution in the y direction. These electric field distributions are expressed in volts per meter (V/m), for example. In addition, m is mass of an ion, and expressed in kilograms (kg), for example. Note that, while calculation is performed in a two-dimensional space defined by the x direction and y direction, a z direction may be added for calculation in a three-dimensional space.

The locus of each of the test ions is bent in a direction different from the depth direction by the effect of the electric field distribution, wherefore each of the test ions reaches a voxel on the side or bottom. The unit time perturbation shape calculation unit 123 calculates an angle formed by an ion flux vector corresponding to the voxel reached by the ion, and the ion incident vector obtained by Equation 3 and Equation 4. When the calculated angle is a predetermined angle threshold or larger, the unit time perturbation shape calculation unit 123 designates the corresponding voxel as a removal voxel to be removed by etching. The unit time perturbation shape calculation unit 123 forms a perturbation shape Vside (1) indicating respective coordinates of removal voxels, and supplies the perturbation shape Vside (1) to the perturbation shape synthesis unit 124. Note that the unit time perturbation shape calculation unit 123 is an example of a perturbation shape prediction unit according to the appended claims.

The perturbation shape synthesis unit 124 performs a process for synthesizing the perturbation shape Vside (1) and a base shape Vbase (2) corresponding to a subsequent time. The perturbation shape synthesis unit 124 changes an attribute of the removal voxel indicated by the perturbation shape Vside (1) from silicon to air in the base shape Vbase (2) to perform the synthesis process, for example. The perturbation shape synthesis unit 124 supplies a synthesized shape to the output unit 170 and the electric field distribution calculation unit 122 as a synthesis shape Vout (2).

The electric field distribution calculation unit 122 obtains an electric field distribution based on the synthesis shape Vout (2), while the unit time perturbation shape calculation unit 123 obtains a perturbation shape Vside (2) based on this electric field distribution. The perturbation shape synthesis unit 124 synthesizes the perturbation shape Vside (2) and a base shape Vbase (3), and outputs the synthesized shape as a synthesis shape Vout (3). On and after s=3, the electric field distribution calculation unit 122 similarly obtains an electric field distribution based on a synthesis shape Vout (s), while the unit time perturbation shape calculation unit 123 obtains a perturbation shape Vside (s) based on this electric field distribution. The perturbation shape synthesis unit 124 synthesizes the perturbation shape Vside (s) and the base shape Vbase (s+1), and outputs a synthesis shape Vout (s+1).

The output unit 170 outputs a simulation result. For example, the synthesis shapes Vout (1) through Vout (S) are output as simulation results. No calculation is performed by the perturbation shape synthesis unit 124 to obtain the initial synthesis shape Vout (1), wherefore the initial base shape Vbase (1) is output as the synthesis shape Vout (1). Note that the simulation result may be visualized via GUI. In addition, output or visualization of the simulation results may be performed at the time of completion of all calculations, or during calculation as real-time results.

As described above, the method according to this example uses a limited number of test particles to handle the charging effect. Accordingly, perturbation shapes are calculated more efficiently by the method of this example than by the conventional method which calculates detailed shapes (base shapes+perturbation shapes) by using Monte Carlo method. Particularly, a shape of a sample subjected to etching at a high aspect ratio is predictable at a speed higher than that speed of Monte Carlo method.

In addition, only calculation of perturbation shapes is needed without the necessity of calculating base shapes which have been calculated beforehand. Accordingly, a calculation amount decreases in comparison with calculation of whole shapes by using Mote Carlo method.

Figure 2:
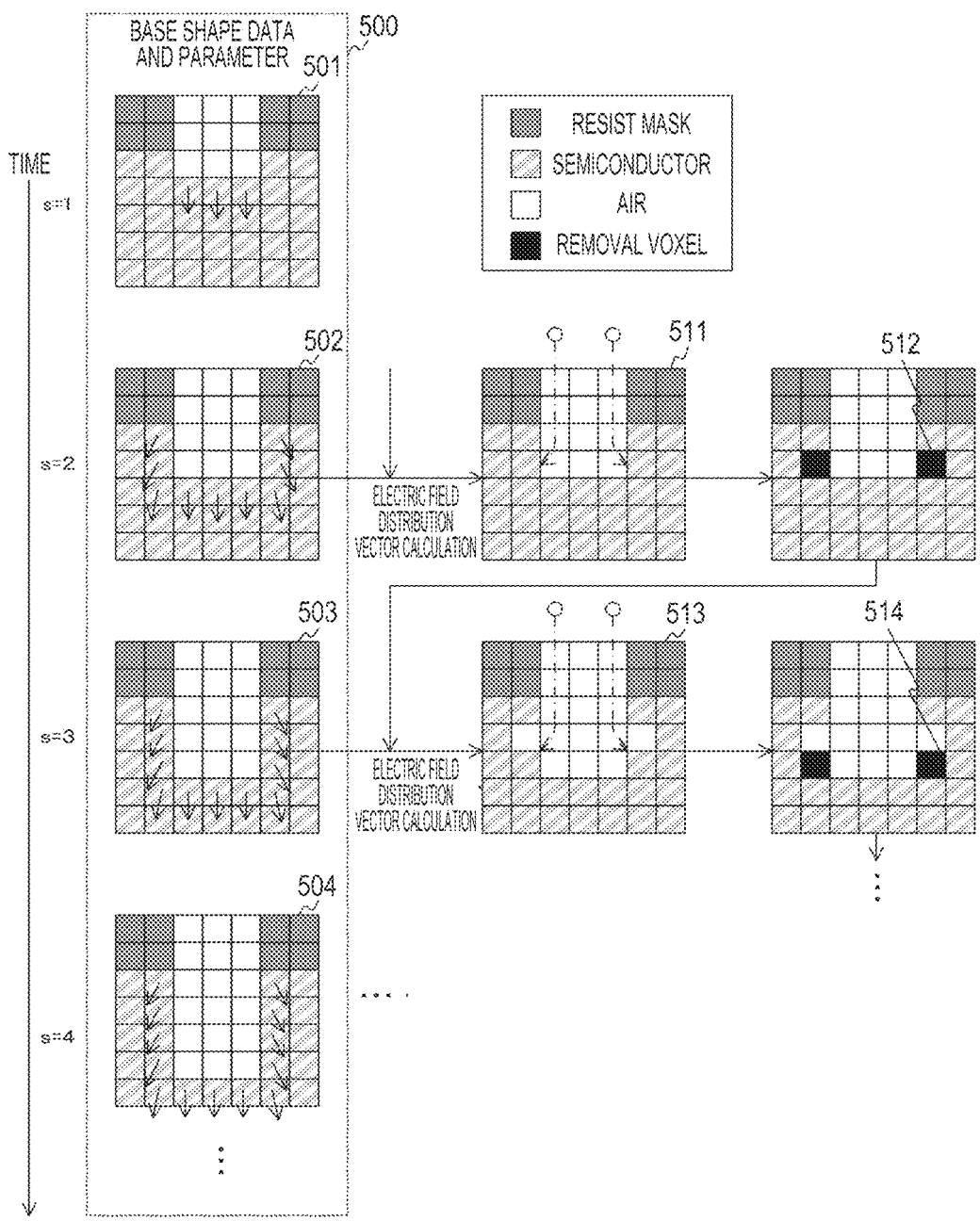
FIG. 2 is a diagram showing a simulation method according to the first embodiment.

FIG. 2 is a view illustrating a simulation method according to the first embodiment. Initially input is input data 500 including base shape data and parameters. The input data 500 contains a plurality of items of data such as data 501 and data 502 in the order of time series. In addition, each of shaded boxes contained in each data indicates a voxel having a semiconductor attribute to be etched, while each of gray boxes indicates a voxel having a resist mask attribute. Each of white boxes indicates a voxel having an air attribute. In addition, each of arrows in semiconductor voxels located adjacently to air indicates an ion flux vector. Data constituted by voxels except for ion flux vectors corresponds to base shape data.

The simulator 100 synthesizes each of base shapes, and a corresponding perturbation shape at a previous time, obtains an electric field distribution based on a synthesis shape thus obtained, and obtains a transportation locus of a corresponding ion based on the electric field distribution thus obtained. For example, a base shape of the data 502 at a time s=2 and a perturbation shape at a previous time s=1 are synthesized to produce a synthesis shape 511. In the synthesis shape 511, each circle indicates a test ion, while each dotted line indicates a transportation locus of the corresponding test ion.

Thereafter, the simulator 100 obtains an angle formed by anion flux vector of a voxel 512 of silicon reached by the ion, and an incident vector of the ion reaching the voxel 512. In case of the obtained angle in excess of an angle threshold, the simulator 100 selects the voxel 512 as a removable voxel. The simulator 100 changes the attribute of the removal voxel 512 from the semiconductor attribute into the air attribute in the base shape of the data 503 at a subsequent time s=3 to form a synthesis shape 513. The simulator 100 obtains an electric field distribution based on the synthesis shape 513, and selects a voxel 514 reached by an ion within the electric field distribution as a removal voxel. Similar processes are repeated until an etching end time.

Suppose that five silicon gate patterns are processed, each of which has a space of 200 nanometers (nm) and a line width of 120 nanometers (nm) in a resist initial state in a specific calculation example. A silicon film thickness is set to 170 nanometers (nm), while a bottom antireflection coating (BARC) film thickness is set to 50 nanometers (nm). In addition, a processing device is constituted by a conductively coupled plasma (CCP) device having two frequencies of 60 megahertz (MHz) for an upper electrode frequency and 13.5 megahertz (MHz) for a lower electrode frequency. Note that the processing device is not limited to a CCP device.

In addition, each base shape is simulated beforehand based on a voxel-slab model under following wafer etching conditions. Details of this simulation are described in "N. Kuboi, et al., Prediction of Plasma-Induced Damage Distribution during Silicon Nitride Etching Using Advanced 3D Voxel Model, International Symposium on Dry Process 2014.", for example. However, steps and processing conditions to be applied are presented only by way of example.

wafer aperture ratio: 80%

BARC Etching Step
  source power: 200 watts (W)
  bias power: 70 watts (W)
  mixed gas pressure of $Cl_2$ and $O_2$: 20 millitorr (mTorr)
  lower electrode (wafer) temperature: 55 degrees (° C.)

Silicon Etching Step
  source power: 200 watts (W)
  bias power: 100 watts (W)
  mixed gas pressure of HBr and $O_2$: 15 millitorr (mTorr)
  lower electrode (wafer) temperature: 55 degrees (° C.)

In the BARC etching step described above, each of flow amounts of $Cl_2$ gas and $O_2$ gas is set to 20 standard cubic centimeters per minute (sccm), for example. On the other hand, in the silicon etching step described above, a flow amount of HBr gas is set to 150 standard cubic centimeters per minute (sccm), while a flow amount of $O_2$ gas is set to 1 standard cubic centimeter per minute (sccm) for example.

Thereafter, the simulator 100 obtains a perturbation shape based on the base shape obtained beforehand. For example, tangents of loci within air attribute voxels located adjacently to silicon are obtained in case of entrance of 20 test ions from an area within 20 nanometers (nm) extended from both side walls of a silicon (Si) gate with energy Vpp=300 volts (V). The simulator 100 calculates angles formed by the tangents and etching vectors of silicon attribute voxels located adjacently to air, and determines voxels having a threshold angle (e.g. 45 degrees) or larger as removable voxels. These calculation procedures are repeated until an elapse of an etching period (e.g. 60 seconds). As a result, the simulator 100 predicts a gate dimension generated by a charging effect as 50 nanometers (nm).

Figure 3A:
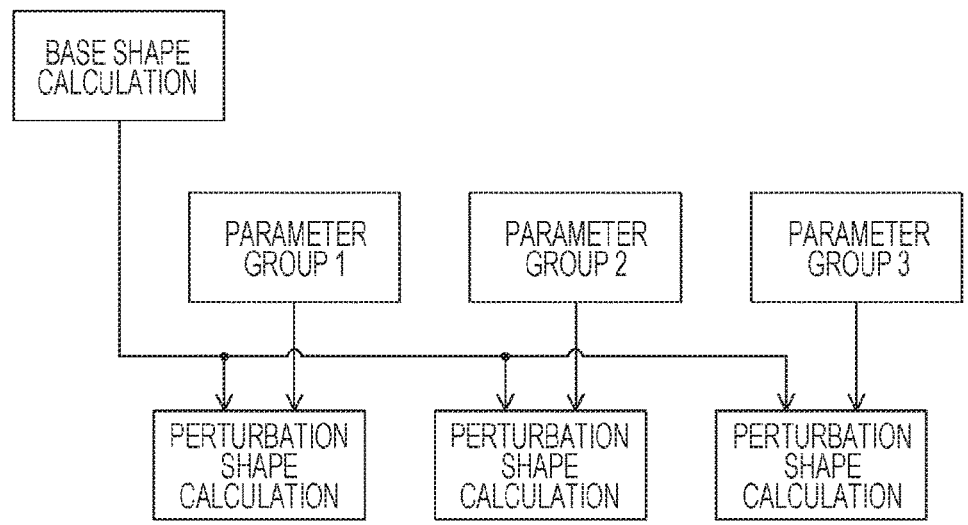
FIGS. 3a and 3b are diagrams showing a comparison between the simulation method in the first embodiment and a comparative example.
Figure 3B:
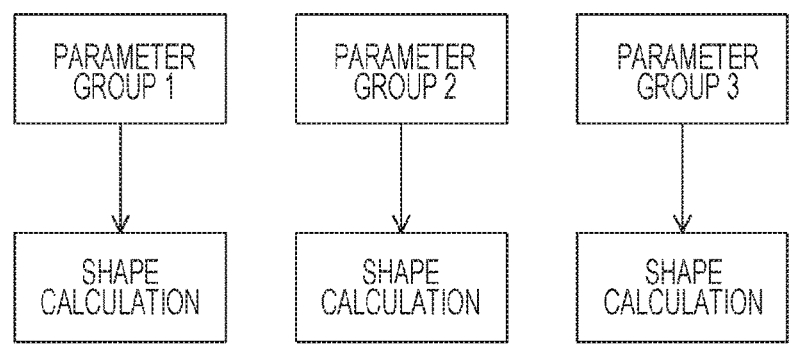

FIGS. 3a and 3b are diagrams showing a comparison between the simulation method according to the first embodiment and a comparative example. FIG. 3a is a diagram showing the simulation method according to the first embodiment. The simulator 100 calculates a base shape beforehand, and predicts a perturbation shape by calculation based on parameters input as a parameter group 1 indicating processing conditions. Subsequently, the simulator 100 predicts a perturbation shape based on each of parameter groups 2 and 3 containing different parameters (processing conditions) associated with electric field distributions, such as bias power, a flux amount, and a flux vector in response to input of the respective parameter groups 2 and 3 to the simulator 100.

FIG. 3b is a diagram showing a simulation method of the comparative example using Monte Carlo method for all processes. A simulator of the comparative example predicts whole shapes of samples based on the parameter group 1. Then, the simulator again predicts detailed shapes of samples (base shape+perturbation shape) based on the parameter groups 2 and 3 subsequently input.

As shown in FIG. 3a, the simulator 100 calculates the base shape beforehand, and subsequently calculates the perturbation shapes based on the parameters associated with the potential distributions. In this case, the necessity of calculating a base shape is eliminated in case of a change of the parameters, wherefore a calculation time dramatically decreases. On the other hand, as shown in FIG. 3b, all calculations need to be repeated for each change of parameters, wherefore a simulation period becomes longer.

[Operation Example of Simulator]

Figure 4:
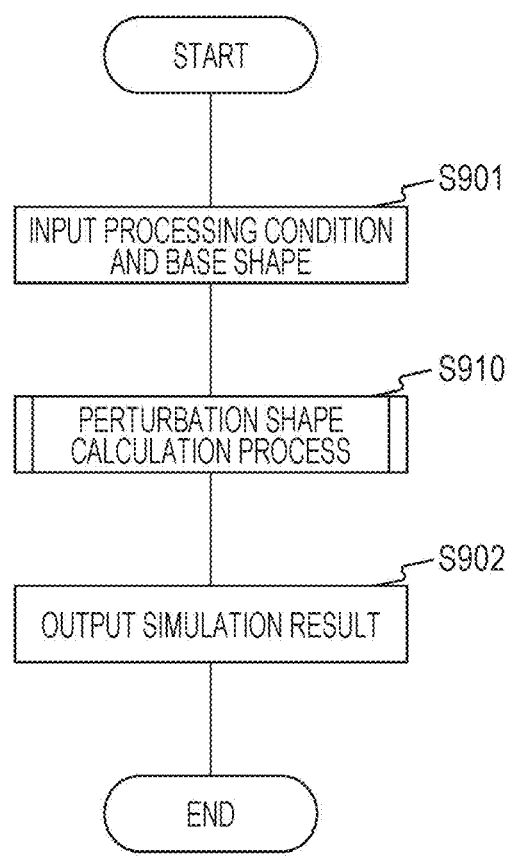
FIG. 4 is a flowchart showing an example of an operation performed by the simulator according to the first embodiment.

FIG. 4 is a flowchart showing an example of an operation performed by the simulator 100 according to the first embodiment. This operation starts in response to execution of a predetermined application for initiating simulation, for example. The simulator 100 receives input data containing processing conditions and base shapes (step S901).

The simulator 100 having received the input data executes a perturbation shape calculation process for calculating perturbation shapes (step S910), and outputs a simulation result (step S902).

Figure 5:
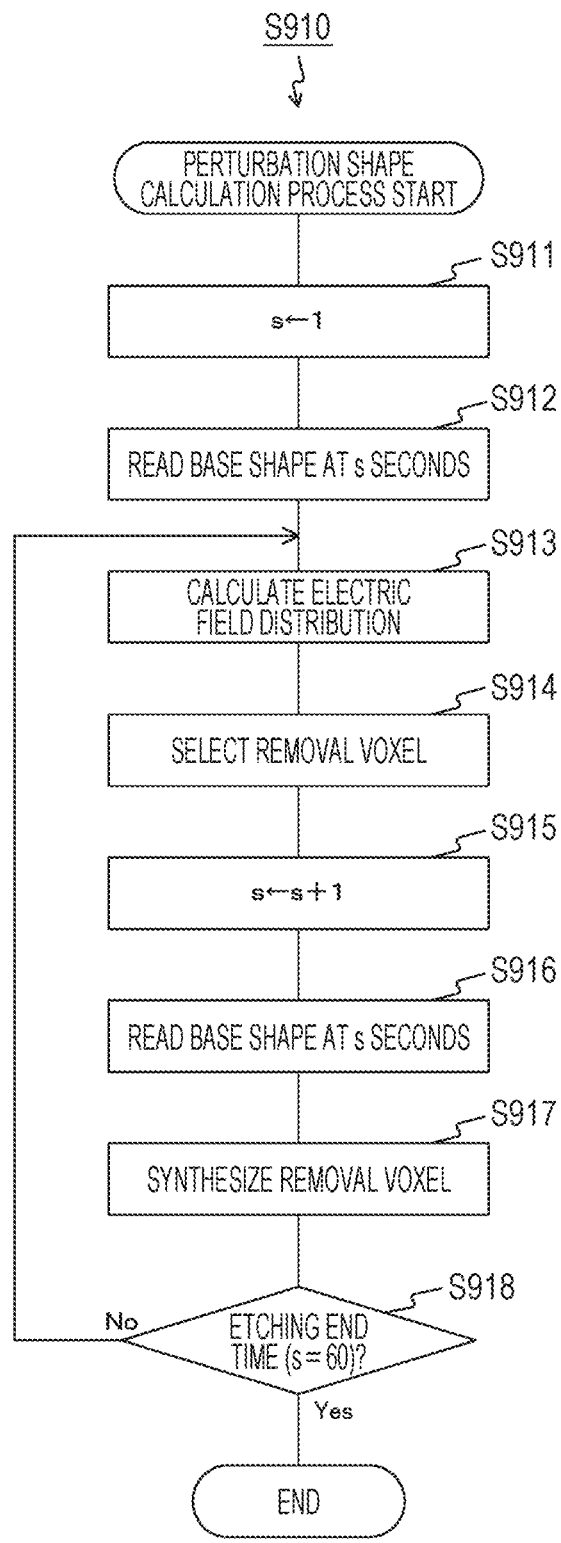
FIG. 5 is a flowchart showing an example of a perturbation shape calculation process according to the first embodiment.

FIG. 5 is a flowchart showing an example of the perturbation shape calculation process according to the first embodiment. The simulator 100 initializes a time s to "1" (step S911), and reads a base shape for a time of s seconds together with corresponding parameters (step S912). Thereafter, the simulator 100 calculates electric field distributions (step S913), calculates loci of ions on the basis of the calculated electric field distributions, and selects removal voxels (step S914). The simulator 100 increments the times (step S915), and reads the base shape for the time of s seconds together with corresponding parameters (step S916). The simulator 100 synthesizes the read base shape and the perturbation shape indicating the removal voxels (step S917).

Thereafter, the simulator 100 determines whether or not the current time is an etching end time (e.g. s=60) (step S918). In case of determination that the current time is not the etching end time (step S918: No), the simulator 100 repeats step S913 and processes after step S913. On the other hand, in case of determination that the current time is the etching end time (step S918: Yes), the simulator 100 ends the perturbation shape calculation process.

According to the first embodiment of the present technology, therefore, electric field distributions are predictable as physical quantities on the basis of processing conditions and base shapes stored beforehand. In this case, re-calculation of base shapes is not required even at the time of a change of processing conditions. With this arrangement, efficiency of prediction of potential distributions improves.

<2. Second Embodiment>

According to the first embodiment described above, the simulator 100 predicts electric field distributions. However, physical quantities other than electric field distributions may be predicted as long as the physical quantities are those produced within the chamber. For example, the simulator 100 may predict distributions of a deactivation degree of impurities injected into a semiconductor, instead of electric field distributions. The deactivation degree in this context indicates a degree of a concentration drop of impurities within a sample from an initial value as a result of diffusion of interstitial silicon (Si) generated by ion bombardment into the sample. The simulator 100 in the second embodiment is different from the simulator 100 in the first embodiment in that deactivation degree distributions are predicted as physical lengths instead of electric field distributions.

FIG. 6 is a block diagram showing a configuration example of the simulator 100 according to the second embodiment. The simulator 100 in the second embodiment is different from the simulator 100 in the first embodiment in that a deactivation degree distribution calculation unit 130 is provided instead of the perturbation shape calculation unit 120.

The deactivation degree distribution calculation unit 130 includes a base shape storage unit 131, an incident ion number calculation unit 132, an ion entrance distribution calculation unit 133, an interstitial silicon distribution calculation unit 134, a unit time deactivation degree distribution calculation unit 135, and a deactivation degree distribution synthesis unit 136.

In addition, parameters according to the second embodiment include a generation rate and a distribution coefficient of interstitial silicon resulting from ion bombardment, activation energy at the time of reaction between interstitial silicon and surrounding impurities, a wafer temperature, and parameters in etching characteristic data.

In addition, etching characteristic data in the second embodiment includes ion energy distribution (ion energy distribution function (IEDF)). The etching characteristic data in the second embodiment further includes ion angular distribution function (IADF). The etching characteristic data further includes ion incident energy, an etch rate vector, a protection film thickness, and a damage amount caused by ion bombardment, as well as IEDF and IADF.

The base shape storage unit 131 stores base shape data, and parameters indicating processing conditions, similarly to the first embodiment.

The incident ion number calculation unit 132 calculates the number of ions entering each of voxels for each voxels. The incident ion number calculation unit 132 initially reads a base shape Vbase (s), and etching characteristic data corresponding to the base shape Vbase (s). Subsequently, the incident ion number calculation unit 132 calculates, for each voxel, the number of ions entering at each unit solid angle dR for each energy width dE from IEDF and IADF, and supplies the calculated numbers to the ion entrance distribution calculation unit 133.

The ion entrance distribution calculation unit 133 calculates an ion entrance distribution indicating the number of entering ions for each voxel. The ion entrance distribution calculation unit 133 calculates ion entrance distributions based on the ion number for each voxel, and supplies the calculated ion entrance distributions to the interstitial silicon distribution calculation unit 134.

The interstitial silicon distribution calculation unit 134 calculates an interstitial silicon distribution indicating a concentration of interstitial silicon for each voxel from the ion entrance distributions. At the time of entrance of an ion into silicon in an etch rate vector direction, the ion generates interstitial silicon within the voxel based on an interstitial silicon generation probability function G(E) while attenuated for each energy. On the basis of this assumption, the interstitial silicon distribution calculation unit 134 inputs incident energy E and a protection film pressure $T_c$ into following equations to obtain the generation probability function G(E). The incident energy is expressed in joules (J), while the protection film pressure is expressed in micrometers (μm).

$$G(E) = b_0 \times \{(E)^{1/2} - (E_{th})^{1/2}\} \quad \text{Equation 5}$$

$$E = E - f(T_c + x) \quad \text{Equation 6}$$

In Equation 5, $b_0$ indicates a real number coefficient, while $E_{th}$ indicates threshold energy for generation of interstitial silicon. In addition, f( ) in Equation 6 indicates an attenuation function which returns a larger value as a value of $(T_c+x)$ increases.

In addition, the interstitial silicon distribution calculation unit 134 continues calculation of concentrations of interstitial silicon by using the generation function G(E) until a voxel which contains data indicating a damage amount in the etch rate vector direction. The interstitial silicon distribution calculation unit 134 supplies the obtained interstitial silicon distributions to the unit time deactivation degree distribution calculation unit 135.

The unit time deactivation degree distribution calculation unit 135 calculates a deactivation degree distribution indicating a deactivation degree for each voxel based on a corresponding interstitial silicon distribution. The unit time deactivation degree distribution calculation unit 135 calculates concentration diffusion based on interstitial silicon concentrations by using following equations to obtain impurity concentrations.

[Mathematical Formula 3]

$$\frac{\partial C_i}{\partial t} = D_i \left( \frac{\partial^2 C_i}{\partial x^2} + \frac{\partial^2 C_i}{\partial y^2} \right) - 4\pi a_T D_i C_i C_B \quad \text{Equation 7}$$

[Mathematical Formula 4]

$$\frac{\partial C_B}{\partial t} = \frac{4\pi a_T D_i C_i C_B}{n} \quad \text{Equation 8}$$

$$D_i = D_0 \exp(-E_d/k_B T) \quad \text{Equation 9}$$

$$a_T = a_0 \exp(-E_d/k_B T) \quad \text{Equation 10}$$

In equation 7, $C_i$ represents a concentration of interstitial silicon, while $D_i$ represents a diffusion coefficient. In addition, t represents time, while $a_T$ represents a reaction coefficient. Furthermore, $C_B$ represents a concentration of impurities such as boron. In this case, concentrations of $C_i$ and $C_B$ are expressed per cubic meter ($/m^3$), for example. In Equation 8, n represents a number of reactions. In Equation 9, $D_0$ represents a real number coefficient. In addition, $E_d$ is activation energy associated with diffusion. Furthermore, $k_B$ represents a Boltzmann's coefficient, while T represents a temperature. The temperature T is expressed in Kelvin degrees (K), for example. In Equation 10, $a_0$ represents a real number coefficient. In addition, $E_b$ represents activation energy associated with reaction. In this case, $E_d$ and $E_b$ are expressed in electron volts (eV), for example.

The unit time deactivation degree distribution calculation unit 135 calculates a drop degree from the calculated initial value of the impurity concentration as a deactivation degree, and generates a deactivation degree distribution Db_step(s) indicating a deactivation degree for each voxel. The unit time deactivation degree distribution calculation unit 135 supplies Db_step(s) to the deactivation degree distribution synthesis unit 136. Note that the unit time deactivation degree distribution calculation unit 135 is an example of the physical quantity prediction unit according to the appended claims.

The deactivation degree distribution synthesis unit 136 synthesizes a previous synthesis deactivation degree distribution Db_out (s−1) and a current deactivation degree distribution Db_step (s) to generate a current synthesis deactivation degree distribution Db_out(s). For synthesis, a current deactivation degree and a previous deactivation degree are added for each voxel, for example. The deactivation degree distribution synthesis unit 136 outputs the synthesis deactivation degree distribution Db_out (s) to the output unit 170. A previous synthesis deactivation degree distribution is absent for an initial deactivation degree distribution, wherefore Db_step (s) is output as Db_out (s) for the initial deactivation degree distribution. The simulator 100 obtains deactivation degrees of impurities in a source region and a drain region below a gate oxide film in this manner.

Figure 7A:
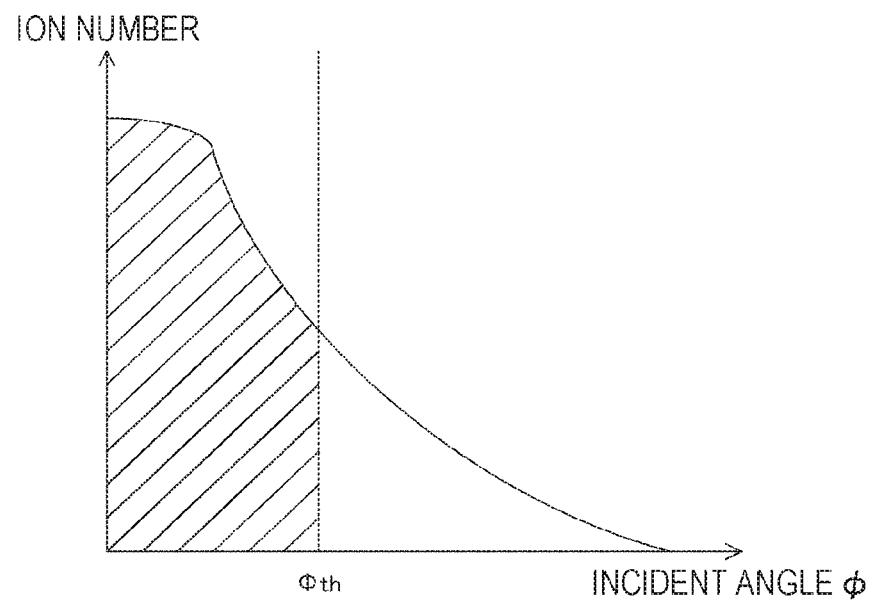
FIGS. 7a and 7b show graphs of an example of an ion incident angle distribution and an ion energy distribution according to the second embodiment.
Figure 7B:
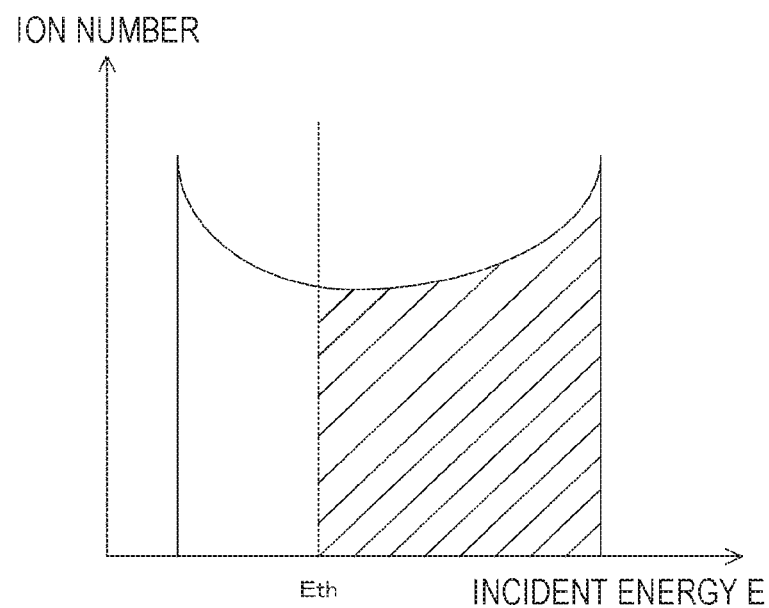

FIGS. 7a and 7b are graphs showing an example of an ion incident angle distribution (IADF) and an ion energy distribution (IEDF) according to the second embodiment. FIG. 7a is a diagram showing an example of the ion incident angle distribution. The vertical axis of FIG. 7a represents the number of ions, while the horizontal axis represents an incident angle. FIG. 7b is a graph showing an example of the ion energy distribution. The vertical axis of FIG. 7b represents the number of ions, while the horizontal axis represents incident energy of ions.

The simulator 100 calculates, for each voxel, the number of ions entering at each unit solid angle dR for each energy width dE based on these distributions.

Figure 8:
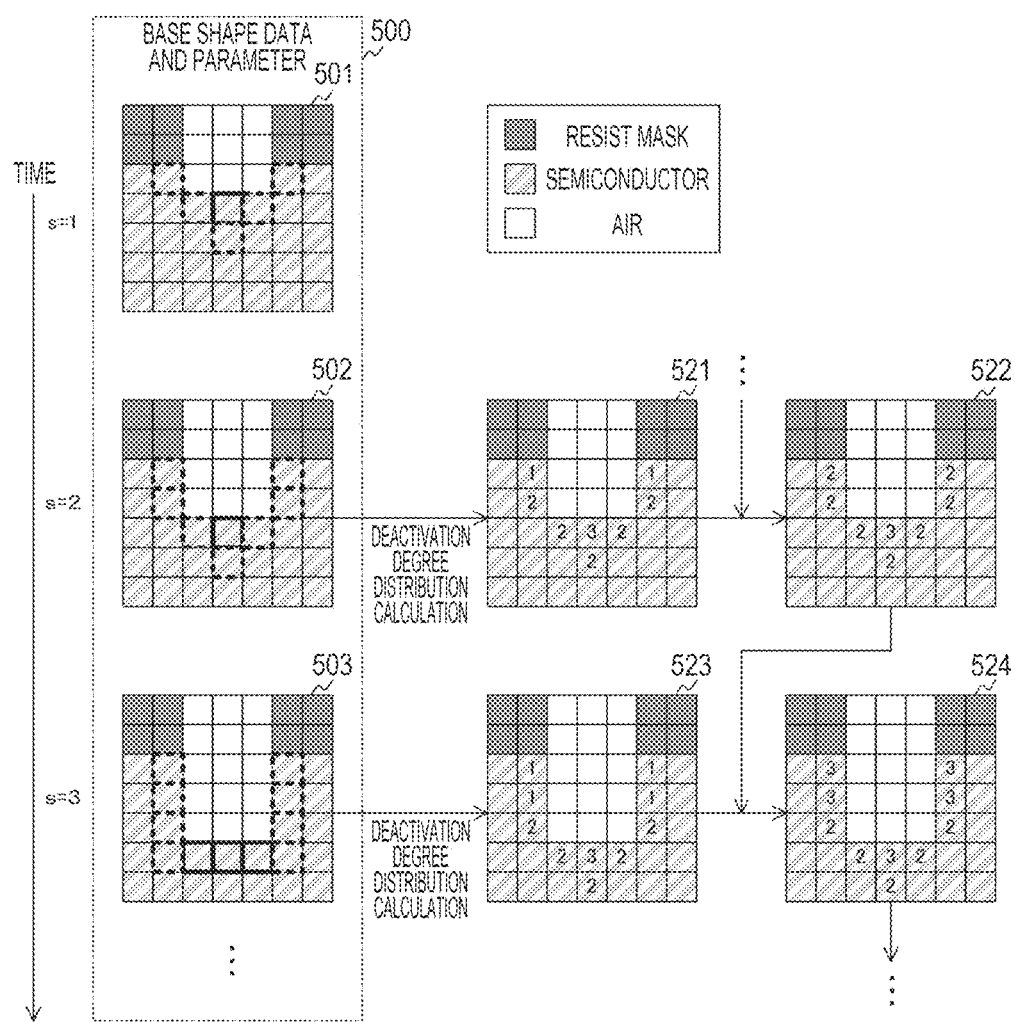
FIG. 8 is a diagram showing a simulation method according to the second embodiment.

FIG. 8 is a view illustrating a simulation method according to the second embodiment. The input data 500 according to the second embodiment includes base shapes, and parameters such as damage amounts resulting from ion bombardment. In the figure, each voxel surrounded by a bold solid line has a large damage amount, while each voxel surrounded by a bold dotted line has a small damage amount.

The simulator 100 calculates a deactivation degree distribution 521 based on a base shape at a time s=2, and parameters corresponding to this base shape. A larger numerical value within a voxel in the deactivation degree distribution 521 indicates a higher deactivation degree. The simulator 100 synthesizes the current deactivation degree distribution 521 and a previous synthesis deactivation degree distribution to generate a current synthesis deactivation degree distribution 522. Thereafter, the simulator 100 calculates a deactivation degree distribution 523 based on a base shape at a subsequent time s=3, and parameters corresponding to this base shape. The simulator 100 synthesizes the current deactivation degree distribution 523 and the previous synthesis deactivation degree distribution 522 to generate a current synthesis deactivation degree distribution 524. Similar procedures are repeated until an etching end time to generate a synthesis deactivation degree distribution for each unit time.

Figure 9A:
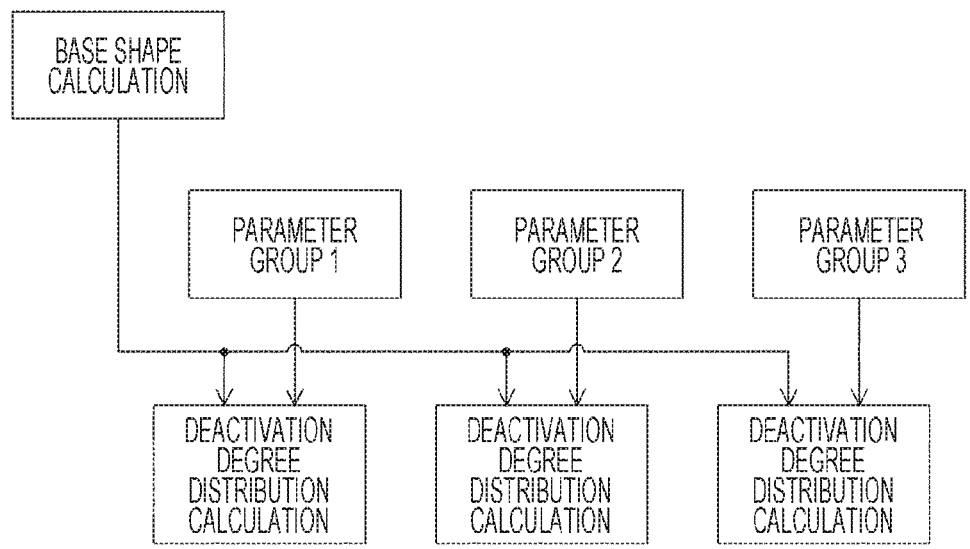
FIGS. 9a and 9b are diagrams showing a comparison example between the simulation method in the second embodiment and a comparative example.
Figure 9B:
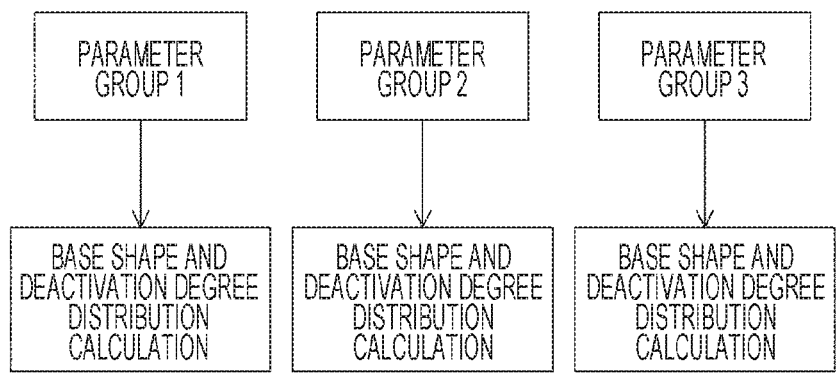

FIGS. 9a and 9b are diagrams showing a comparison between the simulation method according to the second embodiment and a comparative example. FIG. 9a is a diagram showing the simulation method according to the second embodiment. The simulator 100 calculates a base shape beforehand, and predicts a deactivation degree distribution by calculation based on parameters of the parameter group 1 input to the simulator 100. Subsequently, the simulator 100 predicts deactivation degree distributions based on each of parameter groups 2 and 3 containing different parameters associated with deactivation degree distributions, such as a generation rate and a diffusion coefficient of interstitial silicon, and activation energy in response to input of the respective parameter groups to the simulator 100.

FIG. 9b is a diagram showing a simulation method of the comparative example using Monte Carlo method for all processes. A simulator of the comparative example predicts a base shape and a deactivation degree distribution by calculation based on the parameter group 1. Then, the simulator again predicts a base shape and a deactivation degree distribution by calculation based on each of the parameter groups 2 and 3 subsequently input.

As shown in FIG. 9a, the simulator 100 calculates the base shape beforehand, and subsequently calculates the deactivation degree distribution based on the parameters associated with the deactivation degree distribution. In this case, the necessity of calculating a base shape is eliminated in case of a change of the parameters, wherefore a calculation time dramatically decreases. On the other hand, as shown in FIG. 3b, all calculations need to be repeated for each change of parameters, wherefore a simulation period becomes longer.

Figure 10:
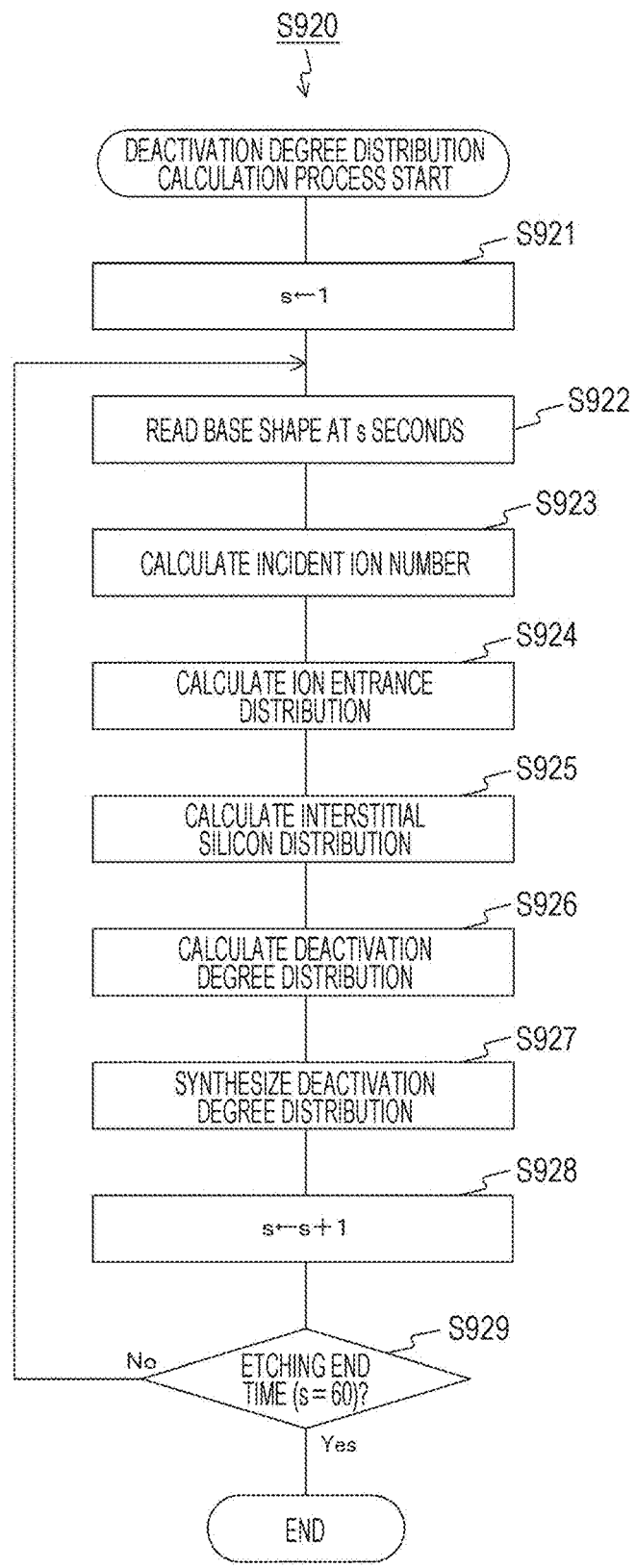
FIG. 10 is a flowchart showing an example of a deactivation degree distribution calculation process according to the second embodiment.

FIG. 10 is a flowchart showing an example of a deactivation degree distribution calculation process according to the second embodiment. In the second embodiment, the deactivation degree distribution calculation process (step S920) is performed instead of the perturbation shape calculation process.

The simulator 100 initializes a time s to "1" (step S921) to read a base shape at a time of s seconds together with corresponding parameters (step S922). Subsequently, the simulator 100 calculates the number of incident ions for each voxel (step S923), and calculates ion entrance distributions based on the calculated number of ions (step S924). Thereafter, the simulator 100 calculates an interstitial silicon distribution based on the ion entrance distribution (step S925), and calculates a deactivation degree distribution based on the interstitial silicon distribution (step S926). The simulator 100 synthesizes a previous synthesis deactivation degree distribution and a current deactivation degree distribution (step S927), increments the time s (step S928), and determines whether or not the current time is an etching end time (step S929). In case of determination that the current time is not the etching end time (step S929: No), the simulator 100 repeats step S922 and steps after step S922. On the other hand, in case of determination that the current time is the etching end time (step S929: Yes), the simulator 100 ends the deactivation degree distribution calculation process.

According to the second embodiment of the present technology, therefore, deactivation degree distributions are predictable as physical quantities on the basis of processing conditions and base shapes stored beforehand. In this case, re-calculation of base shapes is not needed even in case of a change of processing conditions. With this arrangement, efficiency of prediction of deactivation degree distributions increases.

FIRST MODIFIED EXAMPLE

According to the second embodiment described above, a deactivation degree distribution and a synthesis deactivation degree distribution are calculated for each unit time. However, only calculation of a deactivation degree distribution may be performed for each unit time. In this case, calculation results of deactivation degree distributions are synthesized in a lump after calculation of deactivation degree distributions. In this case, a synthesis deactivation degree distribution for each unit time is not obtained during etching, but only one synthesis deactivation degree distribution is obtained at the time of an etching end. The simulator 100 according to a first modified example of the second embodiment is different from the simulator 100 in the second embodiment in that calculation results of deactivation degree distributions, each of which has been obtained in corresponding unit time, are synthesized in a lump.

Figure 11:
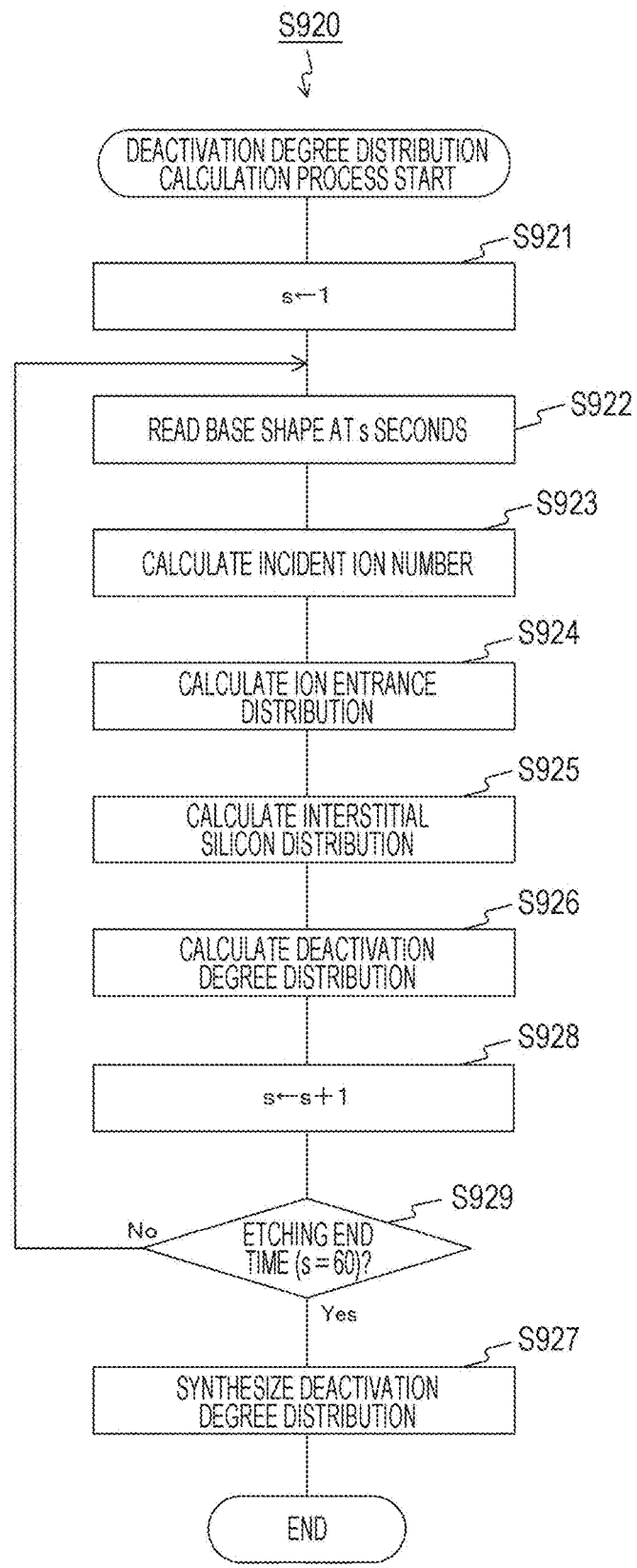
FIG. 11 is a flowchart showing an example of a deactivation degree distribution calculation process according to a first modified example of the second embodiment.

FIG. 11 is a flowchart showing an example of a deactivation degree distribution calculation process according to the first modified example of the second embodiment. The deactivation degree distribution calculation process in the first modified example is different from the corresponding process in the second embodiment in that synthesis of deactivation degree distributions (step S927) is performed after an end of an etching time (step S929: Yes)

According to the first modified example of the second embodiment, deactivation degree distributions obtained for each unit time are synthesized in a lump. In this case, a calculation volume necessary for synthesis decreases, wherefore reduction of a calculation time is achievable.

SECOND MODIFIED EXAMPLE

While calculation performed in the second embodiment described above is only calculation of deactivation degree distributions, calculation of perturbation shapes may be additionally performed. The simulator 100 according to a second modified example of the second embodiment is different from the simulator 100 in the second embodiment in that calculation of both deactivation degree distributions and perturbation shapes is performed.

Figure 12:
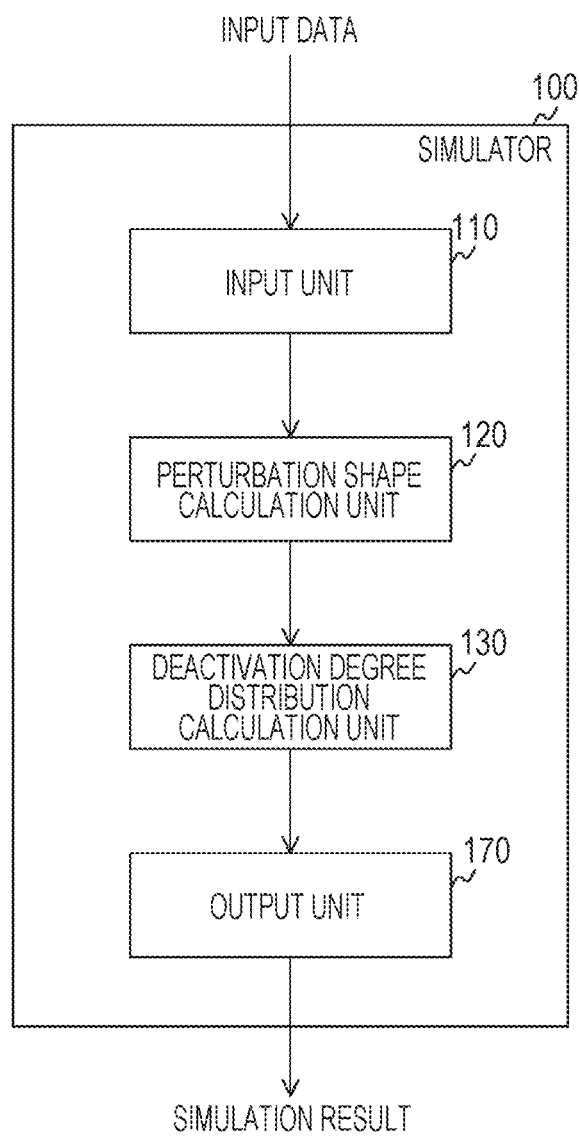
FIG. 12 is a block diagram showing a configuration example of a simulator according to a second modified example of the second embodiment.

FIG. 12 is a block diagram showing a configuration example of the simulator 100 according to the second modified example of the second embodiment. The simulator 100 in the second modified example of the second embodiment is different from the simulator 100 in the second embodiment in that the perturbation shape calculation unit 120 is added.

Parameters in the second modified example include both parameters associated with electric field distributions (e.g. flux spectrum), and parameters associated with deactivation degree distributions (e.g. activation energy).

The perturbation shape calculation unit 120 according to the second modified example calculates perturbation shapes based on procedures similar to the corresponding procedures in the first embodiment, and supplies synthesis shapes obtained for each unit time to the deactivation degree distribution calculation unit 130 together with parameters.

The deactivation degree distribution calculation unit 130 in the second modified example stores synthesis shapes instead of base shapes, and calculates deactivation degree distributions based on the synthesis shapes and parameters.

According to the second modified example of the second embodiment, the simulator 100 stores base shapes, and predicts perturbation shapes and deactivation degree distributions on the basis of processing conditions and the base shapes. In this case, base shapes need not be re-calculated even in case of a change of processing conditions. With this arrangement, efficiency of prediction of perturbation shapes and deactivation degree distribution increases.

<3. Third Embodiment>

According to the first embodiment described above, the simulator 100 predicts electric field distributions. However, physical quantities other than electric field distributions may be predicted as long as the physical quantities are those produced within the chamber. For example, the simulator 100 may predict ultraviolet damage distributions instead of electric field distributions. The ultraviolet damage distributions in this context refer to distributions of ultraviolet damages within a sample. Each of the ultraviolet damage distributions is expressed by an ultraviolet damage amount for each voxel, for example. The ultraviolet damage amount corresponds to a lattice defect amount produced within a sample by ultraviolet light generated by etching gas within the chamber. A simulator according to the third embodiment is different from the simulator in the first embodiment in that ultraviolet damage distributions are predicted as physical quantities instead of electric field distributions.

Figure 13:
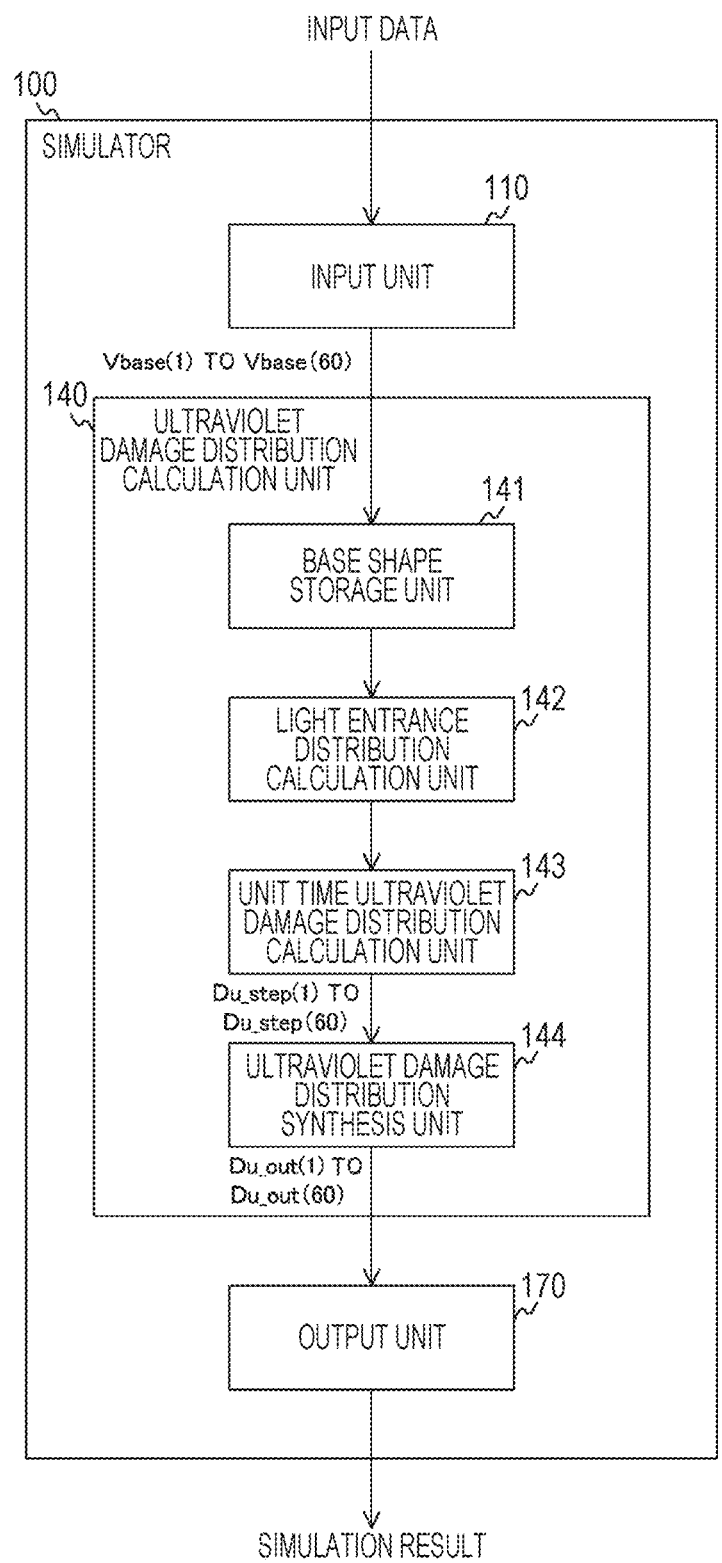
FIG. 13 is a block diagram showing a configuration example of a simulator according to a third embodiment.

FIG. 13 is a block diagram showing a configuration example of the simulator 100 according to the third embodiment. The simulator 100 in the third embodiment is different from the simulator 100 in the first embodiment in that an ultraviolet damage distribution calculation unit 140 is provided instead of the perturbation shape calculation unit 120.

The ultraviolet damage distribution calculation unit 140 includes abase shape storage unit 141, alight entrance distribution calculation unit 142, a unit time ultraviolet damage distribution calculation unit 143, and ultraviolet damage distribution synthesis unit 144.

In addition, parameters in the third embodiment include a wavelength of ultraviolet light, and parameters contained in etching characteristic data. In addition, the etching characteristic data in the third embodiment include an intensity of incident ultraviolet light, a radical flux vector, a protection film thickness, and a damage amount caused by ion bombardment.

The base shape storage unit 141 stores base shape data and parameters similarly to the first embodiment.

The light entrance distribution calculation unit 142 calculates a light entrance distribution indicating an intensity of ultraviolet light entering each voxel. The light entrance distribution calculation unit 142 initially reads a base shape Vbase (s), and etching characteristic data (e.g. protection film thickness $T_c$) corresponding to the base shape. Subsequently, the light entrance distribution calculation unit 142 calculates a light intensity I(x) by using a following equation for a voxel having a predetermined value of a coordinate y (e.g. y=0) until a depth x where an ultraviolet light intensity becomes a set threshold from a voxel located adjacently to air. The light intensity I(x) is similarly calculated for each of y=1 and after. The light entrance distribution calculation unit 142 supplies the light intensity of each of the voxels to the unit time ultraviolet damage distribution calculation unit 143.

$$I(x)=I_0\exp\{-(b_1 \times T_c + b_2 \times x)\} \qquad \text{Equation 11}$$

In the above equation, $I_0$, $b_1$, and $b_2$ are real number coefficients.

The unit time ultraviolet damage distribution calculation unit 143 calculates an ultraviolet damage amount based on an ultraviolet light intensity I (x) by using a following equation.

$$D_{uv}=F(I) \qquad \text{Equation 12}$$

In the above equation, $D_{uv}$ is an ultraviolet damage amount, and F(I) is a function which returns a larger value as the value I becomes larger.

The unit time ultraviolet damage distribution calculation unit 143 generates an ultraviolet damage distribution Du_step (s) indicating an ultraviolet damage amount for each voxel, and supplies the generated distribution Du_step (s) to the ultraviolet damage distribution synthesis unit 144. Note that the unit time ultraviolet damage distribution calculation unit 143 is an example of the physical quantity prediction unit according to the appended claims.

The ultraviolet damage distribution synthesis unit 144 synthesizes a previous synthesis damage distribution Du_out (s−1) and a current ultraviolet damage distribution Du_step (s) to generate a current synthesis damage distribution Du_out (s). For this synthesis, a current ultraviolet damage amount and a previous ultraviolet damage amount are added for each voxel, for example. The deactivation degree distribution synthesis unit 136 outputs a synthesis damage distribution Db_out (s) to the output unit 170. A previous synthesis damage distribution is not present for an initial ultraviolet damage distribution. Accordingly, Du_step (s) is output as Du_out (s) for the initial ultraviolet damage distribution.

As described above, the simulator 100 calculates base shapes beforehand, and calculates ultraviolet damage distributions based on parameters (ultraviolet wavelength and ultraviolet light intensity) associated with ultraviolet damage distributions. In this case, the necessity of calculating a base shape is eliminated in case of a change of the parameters, wherefore a calculation time dramatically decreases.

Note that the simulator 100 according to the third embodiment may calculate deactivation degree distributions in addition to ultraviolet damage distributions. In this case, parameters associated with deactivation degree distributions (activation energy, for example) are additionally input. Moreover, the deactivation degree distribution calculation unit 130 is further added to the simulator 100. The simulator 100 may perform calculations of ultraviolet damage distributions and deactivation degree distributions either in this order or in parallel.

Figure 14:
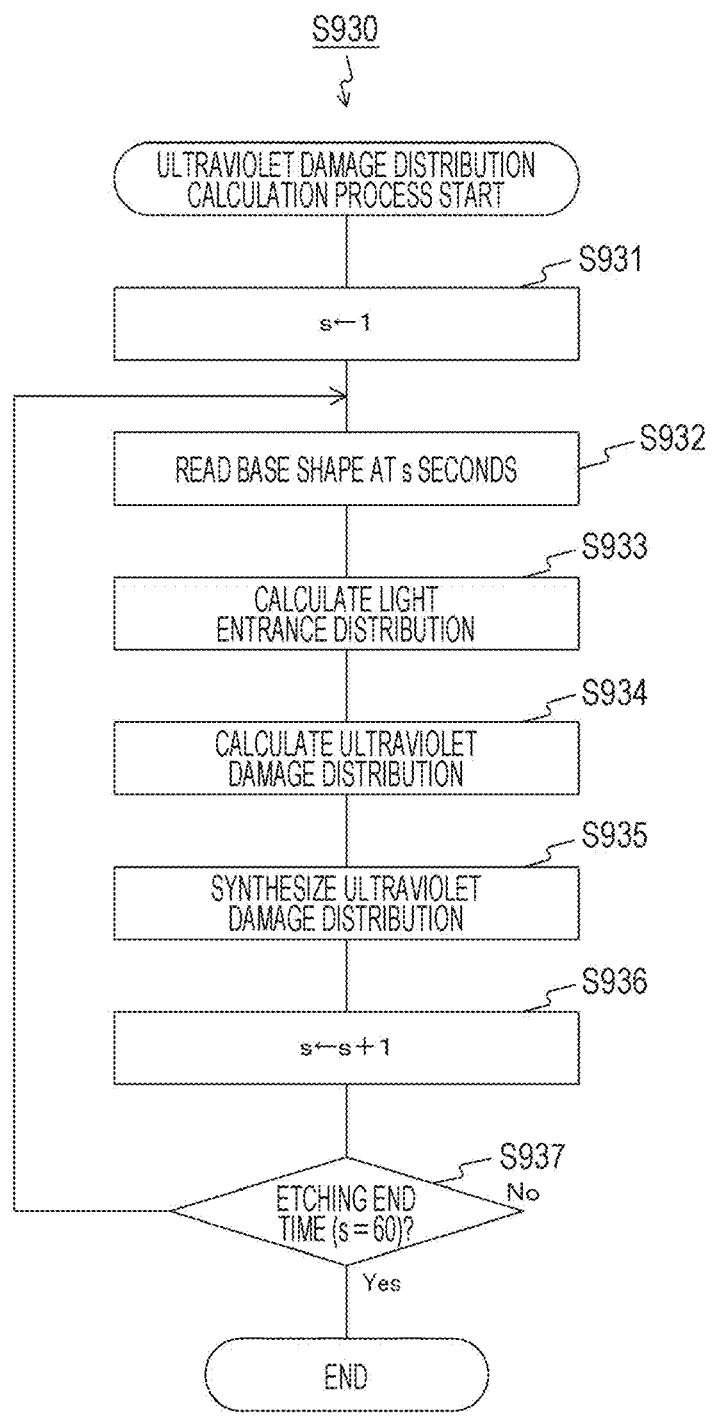
FIG. 14 is a flowchart showing an example of an ultraviolet damage distribution calculation process according to the third embodiment.

FIG. 14 is a flowchart showing an example of an ultraviolet damage distribution calculation process in the third embodiment. According to the third embodiment, the ultraviolet damage calculation process (step S930) is performed instead of the perturbation shape calculation process.

The simulator 100 initializes the time s to "1" (step S931), and reads a base shape at a time of s seconds, and corresponding parameters (step S932). Thereafter, the simulator 100 calculates a light entrance distribution (step S933), and calculates an ultraviolet damage distribution based on the light entrance distribution (step S934). The simulator 100 synthesizes a previous synthesis damage distribution and a current ultraviolet damage distribution (step S935), increments the time s (step S936), and determines whether or not a current time is an etching end time (step S937). In case of determination that the current time is not the etching end time (step S937: No), the simulator 100 repeats step S932 and steps after S932. On the other hand, in case of determination that the current time is the etching end time (step S937: Yes), the simulator 100 ends the ultraviolet damage distribution calculation process.

Note that, while the simulator 100 calculates an ultraviolet damage distribution and a synthesis damage distribution for each unit time, the simulator 100 may perform only calculation of an ultraviolet damage distribution for each unit time, and synthesize calculation results of the respective ultraviolet damage distributions in a lump.

According to the third embodiment of the present technology, therefore, ultraviolet damage distributions are predicted as physical quantities on the basis of base shapes stored beforehand, and processing conditions. In this case, base shapes need not be re-calculated even in case of a change of processing conditions. With this arrangement, efficiency of prediction of ultraviolet damage distributions increases.

MODIFIED EXAMPLE

According to the third embodiment described above, calculation of only the ultraviolet damage distributions is performed. However, calculation of perturbation shapes may be additionally performed. The simulator 100 according to the modified example of the third embodiment is different from the simulator 100 in the third embodiment in that calculation of both ultraviolet damage distributions and perturbation shapes are performed.

Figure 15:
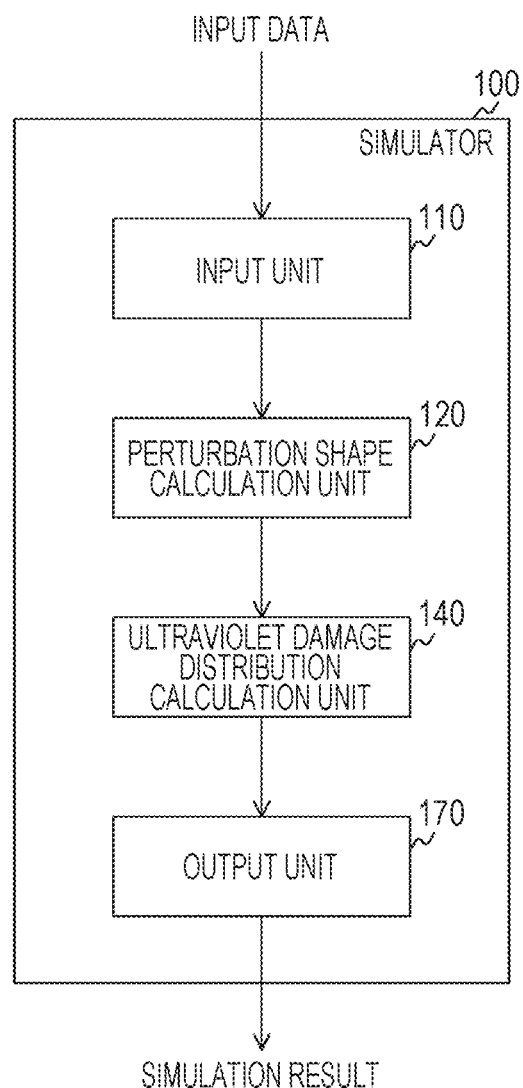
FIG. 15 is a block diagram showing a configuration example of a simulator according to a modified example of the third embodiment.

FIG. 15 is a block diagram showing a configuration example of the simulator 100 according to the modified example of the third embodiment. The simulator 100 in the modified example of the third embodiment is different from the simulator 100 in the third embodiment in that the perturbation shape calculation unit 120 is added.

Parameters according to the modified example include both parameters associated with electric field distributions (e.g. flux spectrum), and parameters associated with ultraviolet damage distributions (e.g. ultraviolet light intensity).

The perturbation shape calculation unit 120 in the modified example calculates perturbation shapes based on procedures similar to the corresponding procedures in the first embodiment, and supplies synthesis shapes for each unit time to the ultraviolet damage distribution calculation unit 140 together with parameters.

The ultraviolet damage distribution calculation unit 140 in the modified example stores synthesis shapes instead of base shapes, and calculates ultraviolet damage distributions based on the synthesis shapes and parameters.

Note that the simulator 100 may further predict deactivation degree distribution in addition to perturbation shapes and ultraviolet damage distributions. In this case, parameters associated with deactivation degree distributions (activation energy, for example) are additionally input. Moreover, the deactivation degree distribution calculation unit 130 is further added to the simulator 100. The simulator 100 may perform calculations of ultraviolet damage distributions and deactivation degree distributions either in this order or in parallel.

According to the modified example of the third embodiment, therefore, the simulator 100 stores base shapes, and predicts perturbation shapes and ultraviolet damage distributions on the basis of processing conditions and the base shapes. In this case, base shapes need not be re-calculated even in case of a change of processing conditions. With this arrangement, efficiency of prediction of ultraviolet damage distributions increases.

<4. Fourth Embodiment>

According to the first embodiment described above, the simulator 100 predicts perturbation shapes based on base shapes calculated beforehand and input to the simulator 100. However, base shapes may be calculated by the simulator 100 before prediction of perturbation shapes. The simulator 100 according to a fourth embodiment is different from the simulator in the first embodiment in that base shapes are calculated by the simulator 100.

Figure 16:
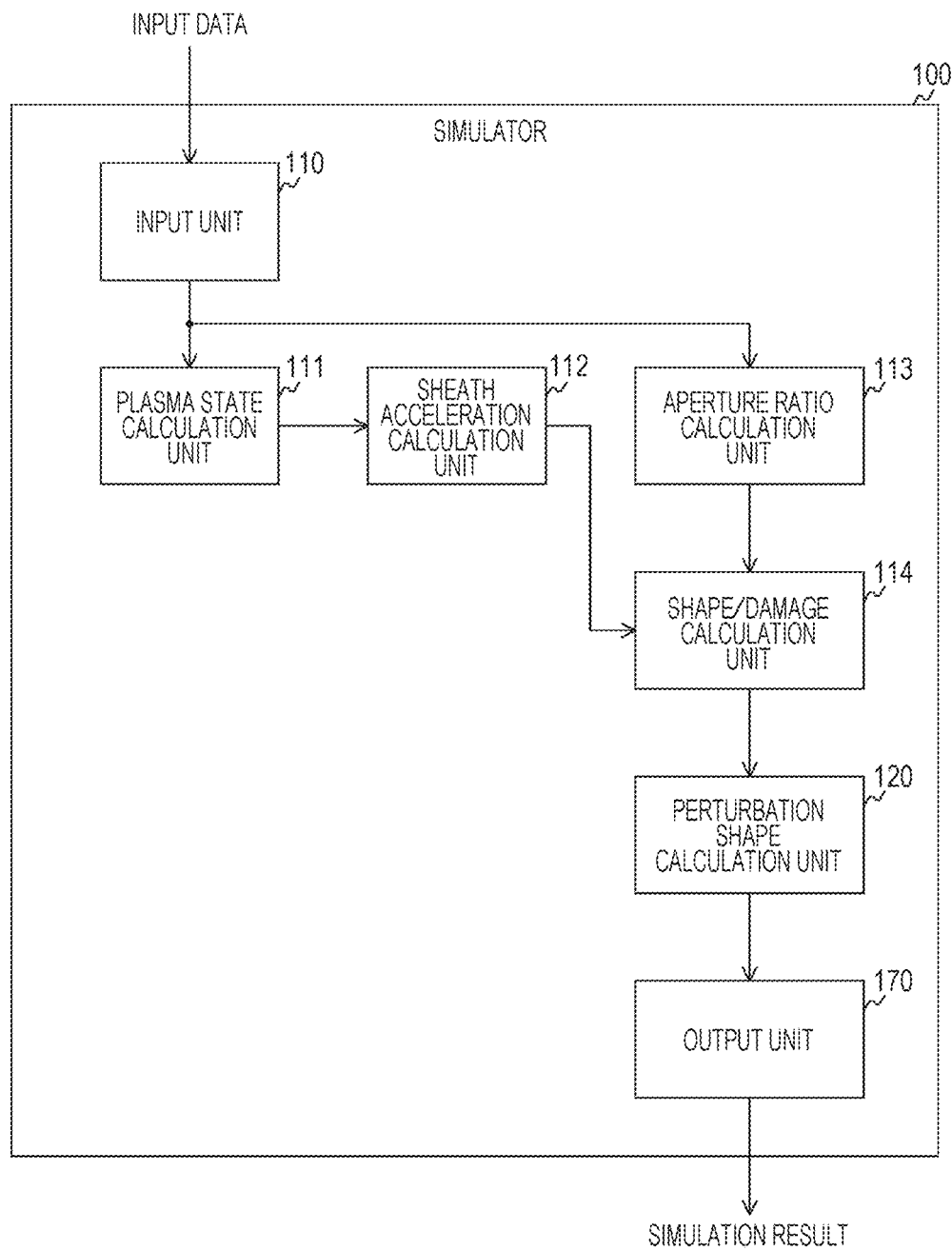
FIG. 16 is a block diagram showing a configuration example of a simulator according to a fourth embodiment.

FIG. 16 is a block diagram showing a configuration example of the simulator 100. The simulator 100 according to the fourth embodiment further includes a plasma state calculation unit 111, a sheath acceleration calculation unit 112, an aperture ratio calculation unit 113, and a shape/damage calculation unit 114.

In addition, according to the fourth embodiment, processing initial conditions such as recipe information, device information, calculation parameters, and graphic data system (GDS) data are input as input data.

The plasma state calculation unit 111 calculates parameters indicating a state of plasma (e.g. gas density). The plasma state calculation unit 111 calculates densities of various types of gases (e.g. ion, radical) within bulk plasma under processing initial conditions, and supplies a calculation result to the sheath acceleration calculation unit 112. Calculation of gas densities is performed based on procedures described in Japanese Patent No. 5397215.

The sheath acceleration calculation unit 112 calculates IEDF and IADF. The sheath acceleration calculation unit 112 calculates energy distributions of ions generated by bulk plasma and having final shapes of acceleration within a sheath, and distributions of incident angle into a pattern, on the basis of gas densities, gas pressure, and applied power. These calculations are performed based on procedures descried in "M. J. Kushner, Distribution of ion energies incident on electrodes incapacitively coupled rf discharges, J. Appl. Phys., 58, 4024 (1985) Database obtained from practical measurement or the like may be used for these distribution functions. The sheath acceleration calculation unit 112 supplies a calculation result to the shape/damage calculation unit 114.

The aperture ratio calculation unit 113 calculates an aperture ratio. The aperture ratio calculation unit 113 calculates a wafer aperture ratio and a semi-local aperture ratio based on GDS data, film thickness information, or other information. The wafer aperture ratio in this context is an aperture ratio of a whole wafer when the wafer is a processing target. On the other hand, the semi-local aperture ratio is an aperture ratio of a chip level formed in the wafer. Calculation of these aperture ratios is performed based on procedures described in Japanese Patent No. 5440021, for example. The aperture ratio calculation unit 113 supplies a calculation result to the shape/damage calculation unit 114.

The shape/damage calculation unit 114 calculates base shapes and damage amounts produced by ions. The shape/damage calculation unit 114 calculates various types of fluxes such as out flux and incident flux on the basis of the aperture ratio. The shape/damage calculation unit 114 further calculates a dangling bond rate and an etching rate on the basis of the calculation result received from the sheath acceleration calculation unit 112. The shape/damage calculation unit 114 calculates base shapes and damages based on these calculation results, and supplies the calculated base shapes and damages to the perturbation shape calculation unit 120. The base shapes are calculated by using a method described in "N. Kuboi, et al., Prediction of Plasma-Induced Damage Distribution during Silicon Nitride Etching Using Advanced 3D Voxel Model, International Symposium on Dry Process 2014".

Note that the shape/damage calculation unit 114 is an example of the base shape prediction unit according to the appended claims.

Figure 17:
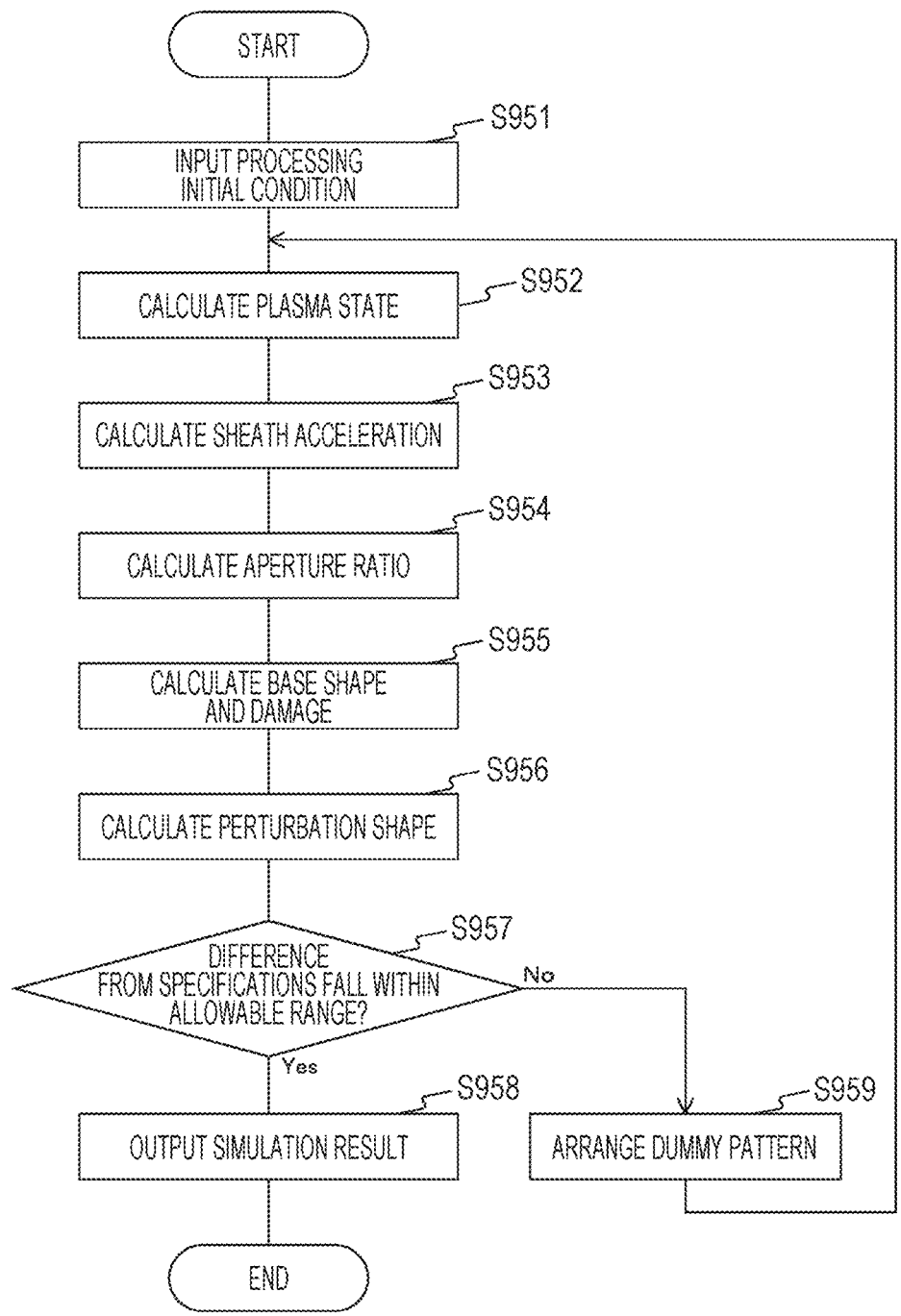
FIG. 17 is a flowchart showing an example of an operation performed by the simulator according to the fourth embodiment.

FIG. 17 is a flowchart showing an example of an operation performed by the simulator 100 according to the fourth embodiment.

The simulator 100 receives input of processing initial conditions (step S951). The simulator 100 having received the processing initial conditions calculates a plasma state (step S952), and performs sheath acceleration calculation (step S953). Subsequently, the simulator 100 calculates the aperture ratio (step S954), and executes calculation of base shapes and damages (step S955). Thereafter, the simulator 100 calculates perturbation shapes on the basis of the base shapes and parameters associated with electric field distributions on the basis of procedures similar to the corresponding procedures in the first embodiment (step S956).

Then, the simulator 100 compares a calculation result of the shapes and damages with required specifications to determine whether or not a difference from the specifications falls within a predetermined allowable range (step S957). In case of determination that the difference from the specifications does not fall within the allowable range (step S957: No), the simulator 100 changes the aperture ratio by arranging a dummy pattern, for example (step S959), and repeats step S952 and steps after step S952. On the other hand, in case of determination that the difference from the specifications falls within the allowable range (step S957: Yes), the simulator 100 outputs a simulation result (step S958), and ends the operation.

The simulator 100 is used for layout designing of a semiconductor device, for example. Note that process designing and optical proximity correction (OPC) designing are also practicable in a similar manner by switching correction factors from arrangement of a dummy pattern to processing conditions or a mask shape.

In addition, the simulator 100 may predict at least either deactivation degree distributions or ultraviolet damage distributions without predicting perturbation shapes. Furthermore, the simulator 100 may predict at least either deactivation degree distributions or ultraviolet damage distributions in addition to prediction of perturbation shapes.

According to the fourth embodiment of the present technology, base shapes are predicted, whereafter perturbation shapes are predicted based on the base shapes. Accordingly, accuracy of prediction of shapes increases.

<5. Fifth Embodiment>

While shape prediction is performed in the fourth embodiment described above, sample processing may be further performed based on a prediction result of the shape prediction. The fifth embodiment is different from the fourth embodiment in that sample processing is further performed by utilizing a prediction result of shapes or the like.

Figure 18:
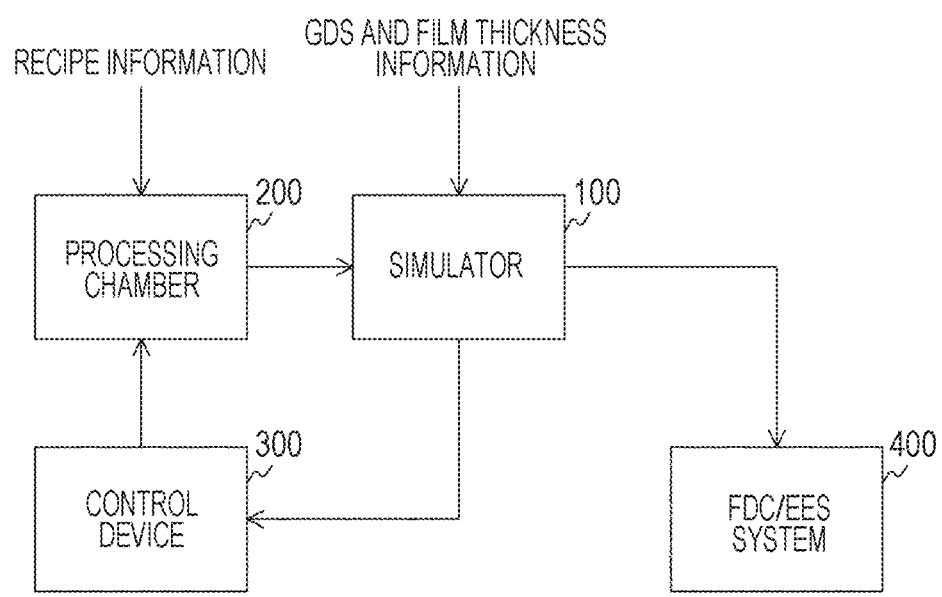
FIG. 18 is a general diagram showing an example of a manufacturing system according to a fifth embodiment.

FIG. 18 is a general diagram showing an example of a manufacturing system according to the fifth embodiment. The manufacturing system is a system for manufacturing a semiconductor device, and includes the simulator 100, a processing chamber 200, and a control device 300. The manufacturing system further includes a fault detection and classification (FDC) and equipment engineering system (EES) system 400. Note that the device including the simulator 100, the processing chamber 200, and the control device 300 is an example of a processing device according to the appended claims.

A processing step performed herein is a gate side wall processing for polysilicon having a film thickness of 170 nanometers, for example. In addition, following conditions are input as processing initial conditions.

wafer aperture ratio: 70%

BARC Etching Step
source power: 200 watts (W)
bias power: 70 watts (W)
mixed gas pressure of $Cl_2$ and $O_2$: 20 millitorr (mTorr)
lower electrode temperature: 55 degrees (° C.)

Silicon Etching Step
source power: 200 watts (W)
bias power: 100 watts (W)
HBr and $O_2$ mixed gas pressure: 15 millitorr (mTorr)
lower electrode temperature: 55 degrees (° C.)

In the BARC etching step described above, the flow amount of each of $Cl_2$ gas and $O_2$ gas is set to 20 standard cubic centimeters per minute (sccm), for example. On the other hand, in the silicon etching step, the flow amount of HBr gas is set to 150 standard cubic centimeters per minute (sccm), while the flow amount of $O_2$ gas is set to 2 standard cubic centimeters per minute (sccm).

The processing chamber 200 processes a processing target such as a semiconductor wafer. The processing chamber 200 is constituted by a CCP type device, for example. An optical emission spectroscopy (OES), and quadrupole mass spectroscopy (QMS) are mounted on the processing chamber 200 to acquire input data necessary for simulation. In addition, infrared-diode laser absorption spectroscopy (IR-LAS), an energy spectrum analyzer and the like are mounted for a similar reason. Plasma is constantly monitored by these devices during processing. A sampling speed is set to 0.1 seconds (s), for example. Information acquired by these devices during processing is transmitted to the simulator 100 together with processing conditions. Note that the processing chamber 200 is an example of a processing unit according to the appended claim.

The simulator 100 according to the fifth embodiment has a configuration similar to the fourth embodiment described above. The simulator 100 calculates gas densities, gas fluxes, ion energy distributions, and incident angle distributions on the basis of data received from the processing chamber 200. All of these may be calculated by using reactor simulation if a calculation time is sufficiently shorter than a real processing time. The simulator 100 further calculates aperture ratios based on GDS and film thickness information, and calculates shapes and damages in consideration of contribution of the aperture ratios to flux.

In case of deviation of a calculation result of shapes or damages from desired specifications, the simulator 100 changes process parameters in the order of a gas flow amount, gas pressure, applied power, and a wafer temperature, and performs re-calculation to find correction conditions for meeting the desired specifications. For example, a side wall width of 60 nanometers (nm) is set as the desired specifications. In this case, it is determined, for example, whether or not the calculation result falls out of an allowable range of ±10% of the desired width. Concerning the damage amount, it is determined, for example, whether or not the calculation result falls out of an allowable range of 50% of the desired amount.

Note that, the processing chamber 200 may be constituted by a device other than CCP type device as long as the device generates plasma, such as inductively coupled plasma (ICP) type, and electron cyclotron resonance (ECR) type.

The simulator 100 having found correction conditions transmits the correction conditions to the control device 300. On the other hand, the simulator 100 not having found correction conditions generates an alert signal, and transmits the alert signal to the FDC and EES system 400.

Note that the simulator 100 may be configured not to calculate shapes or damages during processing, but to calculate shapes and damages before processing, and store the calculated shapes or damages in a database in case of the calculation time equivalent to or longer than the real processing time. In this case, the processing chamber 200 may perform processing in accordance with the database.

The control device 300 controls the processing chamber 200. The control device 300 changes process parameters of the processing chamber 200 on the basis of correction conditions obtained by the simulator 100, and supplies the changed process parameters to the processing chamber 200 as new parameters (processing conditions). Note that the control device 300 is an example of a control unit according to the appended claims.

The FDC and EES system 400 performs a function of detecting and classifying abnormality, and a device engineering function for collecting, monitoring, and controlling a driving status of the device. The FDC and EES system 400 having received an alert signal from the simulator 100 analyzes the alert signal, and stops the whole manufacturing system if necessary.

An image sensor, a driving circuit, and a signal processing circuit are manufactured by using the manufacturing system thus configured, for example. These devices are further assembled into an electronic device such as an imaging device.

Figure 19:
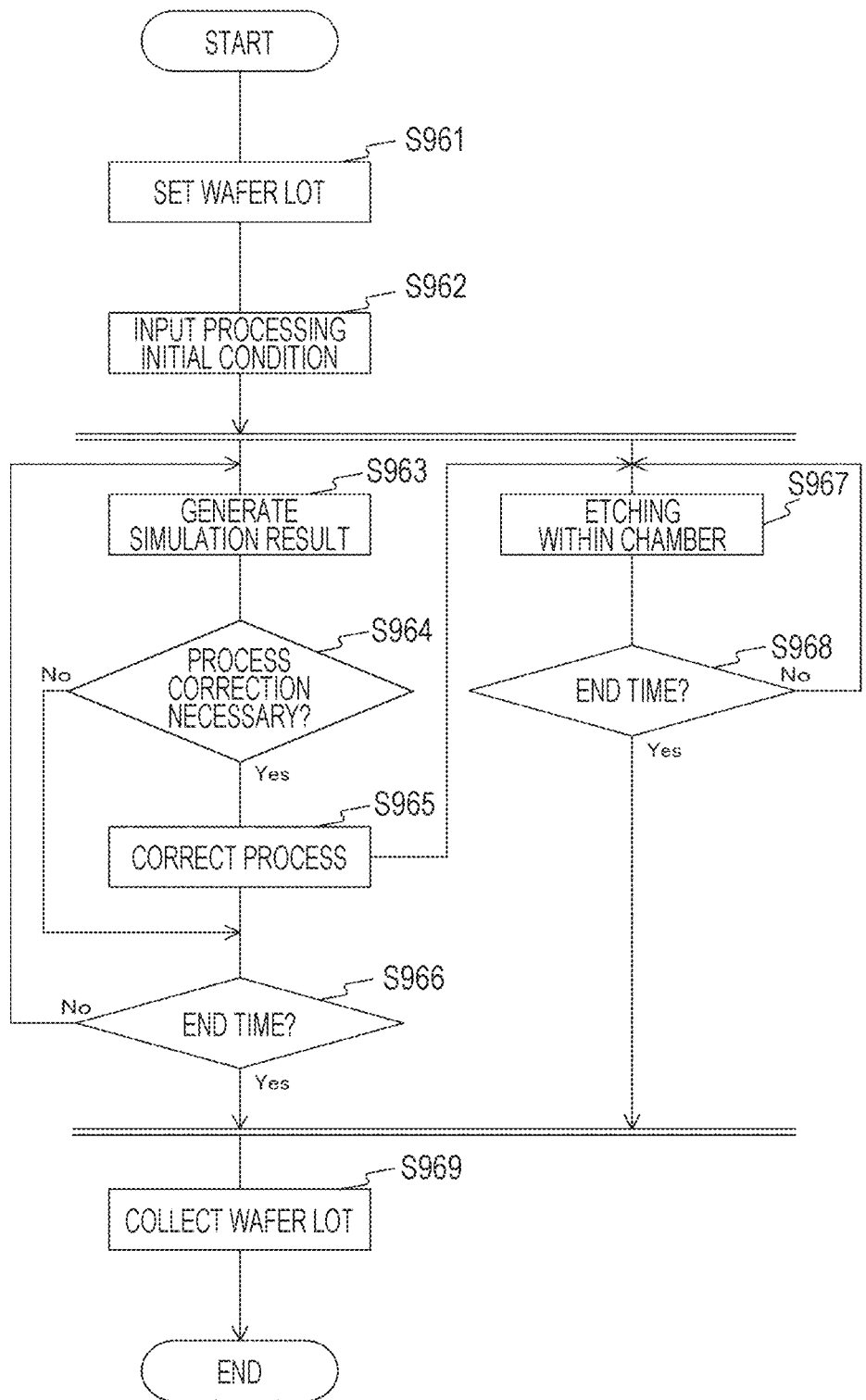
FIG. 19 is a flowchart showing an example of an operation of the manufacturing system according to the fifth embodiment.

FIG. 19 is a flowchart showing an example of an operation of the manufacturing system according to the fifth embodiment. A wafer lot is initially set to the processing chamber 200 by a transfer robot or an operator (step S961). Processing initial conditions (process recipe) are input directly by the operator, or automatically by a device function (step S962).

The simulator 100 generates a simulation result such as shapes and damages (step S963). Thereafter, the simulator 100 compares the simulation result and desired specifications to determine whether or not process correction is necessary (step S964). In case of determination that process correction is necessary (step S964: Yes), the control device 300 corrects the process (step S965).

On the other hand, in case of determination that process correction is unnecessary (step S964: No), the simulator 100 determines whether or not the current time is an etching end time (step S966). In case of determination that the current time is not the end time (step S966: No), the simulator 100 repeats step S963 and steps after step S963. On the other hand, in case of determination that the current time is the end time (step S966: Yes), the simulator 100 stops the operation.

The processing chamber 200 further performs etching within the chamber (step S967), and determines whether or not the current time is the etching end time (step S968). In case of determination that the current time is not the end time (step S968: No), the processing chamber 200 repeats step S967 and steps after step S967. In case of determination that the current time is the end time (step S968: yes), the processing chamber 200 stops the etching operation.

After the end of the operations of the simulator 100 and the processing chamber 200, the wafer lot is collected by the transfer robot or the operator (step S969). After completion of step S969, the manufacturing operation ends.

Note that, while the manufacturing system performs processing by plasma etching, etching other than plasma etching may be performed as long as plasma is used for processing a semiconductor. For example, the manufacturing system may perform processing by using chemical vapor deposition (CVD) or physical vapor deposition (PVD).

According to the fifth embodiment of the present technology described above, the manufacturing system performs etching on the basis of a prediction result such as shapes. Accordingly, accuracy of processing improves.

Note that the respective embodiments described above are presented by way of examples for realizing the present technology. Matters included in the embodiments, and specific matters of the invention according to the appended claims are correlated with each other. Similarly, the specific matters of the invention according to the appended claims, and matters to which identical names are given in the embodiments of the present technology are correlated with each other. However, the present technology is not limited to the embodiments herein, but may be realized with various modifications of the embodiments without departing from the subject matters of the embodiments.

In addition, the processing procedures described in the foregoing embodiments may be considered as a method including a series of these procedures, as a program under which a computer executes the series of procedures, or as a recording medium in which the program is stored. For example, the recording medium is constituted by a compact disc (CD), a minidisc (MD), a digital versatile disc (DVD), a memory card, a Blu-ray (registered trademark) disc or the like.

Note that advantages to be offered are not limited to the aforementioned advantage, but may be any of advantages described in the present disclosure.

Note that the present technology may have following configurations.

(1) An information processing device including:

a base shape storage unit that stores a shape of a sample etched within a chamber as a base shape; and a physical quantity prediction unit that predicts a physical quantity within the chamber on the basis of a processing condition determined for the sample and associated with the physical quantity and the base shape.

(2) The information processing device according to (1) noted above, in which the physical quantity prediction unit predicts an electric field distribution within the chamber as the physical quantity.

(3) The information processing device according to (2) noted above, in which the processing condition includes at least one of electrode bias power that produces the electric field distribution, and of a flux amount and a flux vector of a particle within the chamber.

(4) The information processing device according to (2) or (3) noted above, further including a perturbation shape prediction unit that predicts, on the basis of the electric field distribution, a perturbation shape that is a shape of the sample etched in a side direction different from a depth direction perpendicular to a surface of the sample.

(5) The information processing device according to any one of (1) through (4) noted above, in which the sample is a semiconductor that contains an impurity, and the physical quantity prediction unit predicts a distribution of a deactivation degree that indicates a drop degree of a concentration of the impurity from an initial value of the concentration.

(6) The information processing device according to (5) noted above, in which the sample is a semiconductor that contains an impurity, and the processing condition includes at least one of a generation rate of interstitial silicon generated by ion bombardment, a diffusion coefficient of the interstitial silicon, and activation energy and a wafer temperature necessary for reaction between the interstitial silicon and the impurity.

(7) The information processing device according to any one of (1) through (6) noted above, in which the physical quantity prediction unit predicts a distribution of a damage amount of the sample produced by ultraviolet light generated within the chamber as the physical quantity.

(8) The information processing device according to (7) noted above, in which the processing condition includes at least one of a wavelength of the ultraviolet light and an intensity of the ultraviolet light.

(9) The information processing device according to any one of (1) through (8) noted above, in which the base shape storage unit stores the base shape for each unit time, and the physical quantity prediction unit predicts, for each unit time, the physical quantity on the basis of the base shape and the processing shape for the corresponding unit time.

(10) The information processing device according to any one of (1) through (9) noted above, further including a base shape prediction unit that predicts the base shape and retains the base shape in the base shape storage unit.

(11) A processing device including:

a base shape storage unit that stores a shape of a sample etched within a chamber as a base shape; and a physical quantity prediction unit that predicts a physical quantity within the chamber on the basis of a processing condition determined for the sample and associated with the physical quantity and the base shape;

a processing unit that processes the sample on the basis of the processing condition; and a control unit that changes the processing condition on the basis of the predicted physical quantity, and supplies the changed processing condition to the processing unit as a new processing condition.

(12) A prediction method including:

a reading step that reads abase shape from a base shape storage unit that stores a shape of a sample etched within a chamber as the base shape; and a physical quantity prediction step that predicts a physical quantity within the chamber on the basis of a processing condition determined for the sample and associated with the physical quantity and the base shape read from the base shape storage unit.

(13) A program under which a computer executes:

a reading step that reads abase shape from a base shape storage unit that stores a shape of a sample etched within a chamber as the base shape; and a physical quantity prediction step that predicts a physical quantity within the chamber on the basis of a processing condition determined for the sample and associated with the physical quantity and the base shape read from the base shape storage unit.

(14) A processing method including:

a reading step that reads abase shape from a base shape storage unit that stores a shape of a sample etched within a chamber as the base shape;

a physical quantity prediction step that predicts a physical quantity within the chamber on the basis of a processing condition determined for the sample and associated with the physical quantity and the base shape read from the base shape storage unit;

a processing step performed by a processing unit to process the sample on the basis of the processing condition; and a control step that changes the processing condition on the basis of the predicted physical quantity, and supplies the changed processing condition to the processing unit as a new processing condition.

REFERENCE SIGNS LIST

100 Simulator
110 Input unit
111 Plasma state calculation unit
112 Sheath acceleration calculation unit
113 Aperture ratio calculation unit
114 Shape/damage calculation unit
120 Perturbation shape calculation unit
121, 131, 141 Base shape storage unit
122 Electric field distribution calculation unit
123 Unit time perturbation shape calculation unit
124 Perturbation shape synthesis unit
130 Deactivation degree distribution calculation unit
132 Incident ion number calculation unit
133 Ion entrance distribution calculation unit
134 Interstitial silicon distribution calculation unit
135 Unit time deactivation degree distribution calculation unit
136 Deactivation degree distribution synthesis unit
140 Ultraviolet damage distribution calculation unit
142 Light entrance distribution calculation unit 143 Unit time ultraviolet damage distribution calculation unit
144 Ultraviolet damage distribution synthesis unit
170 Output unit
200 Processing chamber
300 Control device
400 FDC and EES system

The invention claimed is:

1. An information processing device, comprising:
a base shape storage unit configured to store a shape of a sample etched within a chamber as a base shape; and
a physical quantity prediction unit configured to predict a physical quantity within the chamber based on a processing condition determined for the sample and the base shape, wherein
an electric field distribution within the chamber is predicted as the physical quantity,
the processing condition is associated with the physical quantity, and
the processing condition includes at least one of electrode bias power that produces the electric field distribution, a flux amount of a particle within the chamber, or a flux vector of the particle within the chamber.

2. The information processing device according to claim 1, further comprising a perturbation shape prediction unit configured to predict, based on the electric field distribution, a perturbation shape of the sample, wherein
the sample is etched in a side direction different from a depth direction, and
the depth direction is perpendicular to a surface of the sample.

3. The information processing device according to claim 1, wherein
the sample is a semiconductor that contains an impurity,
the physical quantity prediction unit is further configured to predict a distribution of a deactivation degree, and
the deactivation degree indicates a drop degree of a concentration of the impurity from an initial value of the concentration of the impurity.

4. The information processing device according to claim 3, wherein
the processing condition further includes at least one of a generation rate of interstitial silicon generated by ion bombardment, a diffusion coefficient of the interstitial silicon, activation energy necessary for reaction between the interstitial silicon and the impurity, or a wafer temperature necessary for the reaction between the interstitial silicon and the impurity.

5. The information processing device according to claim 1, wherein
the physical quantity prediction unit is further configured to predict a distribution of a damage amount of the sample, and
the damage amount is produced by ultraviolet light generated within the chamber as the physical quantity.

6. The information processing device according to claim 5, wherein the processing condition further includes at least one of a wavelength of the ultraviolet light or an intensity of the ultraviolet light.

7. The information processing device according to claim 1, wherein
the base shape storage unit is further configured to store the base shape for each unit time, and
the physical quantity prediction unit is further configured to predict, for each unit time, the physical quantity based on the base shape and a processing shape for a corresponding unit time.

8. The information processing device according to claim 1, further comprising a base shape prediction unit configured to:
predict the base shape; and
retain the base shape in the base shape storage unit.

9. A processing device, comprising:
a base shape storage unit configured to store a shape of a sample etched within a chamber as a base shape;
a physical quantity prediction unit configured to predict a physical quantity within the chamber based on a processing condition determined for the sample and the base shape, wherein
an electric field distribution within the chamber is predicted as the physical quantity,
the processing condition is associated with the physical quantity, and
the processing condition includes at least one of electrode bias power that produces the electric field distribution, a flux amount of a particle within the chamber, or a flux vector of the particle within the chamber;
a processing unit configured to process the sample based on the processing condition; and
a control unit configured to:
change the processing condition based on the predicted physical quantity; and
supply the changed processing condition to the processing unit as a new processing condition.

10. A prediction method, comprising:
reading a base shape from a base shape storage unit, wherein the base shape storage unit is configured to store a shape of a sample etched within a chamber as the base shape; and
predicting a physical quantity within the chamber based on a processing condition determined for the sample and the base shape read from the base shape storage unit, wherein
an electric field distribution within the chamber is predicted as the physical quantity,
the processing condition is associated with the physical quantity, and
the processing condition includes at least one of electrode bias power that produces the electric field distribution, a flux amount of a particle within the chamber, or a flux vector of the particle within the chamber.

11. A non-transitory computer-readable medium having stored thereon, computer executable-instructions that, when executed by a processor, cause the processor to execute operations, the operations comprising:
reading a base shape from a base shape storage unit, wherein the base shape storage unit is configured to store a shape of a sample etched within a chamber as the base shape; and
predicting a physical quantity within the chamber based on a processing condition determined for the sample and the base shape read from the base shape storage unit, wherein
an electric field distribution within the chamber is predicted as the physical quantity,
the processing condition is associated with the physical quantity, and
the processing condition includes at least one of electrode bias power that produces the electric field distribution, a flux amount of a particle within the chamber, or a flux vector of the particle within the chamber.

12. A processing method, comprising:
reading a base shape from a base shape storage unit, wherein the base shape storage unit is configured to store a shape of a sample etched within a chamber as the base shape;
predicting a physical quantity within the chamber based on a processing condition determined for the sample and the base shape read from the base shape storage unit, wherein
- an electric field distribution within the chamber is predicted as the physical quantity,
- the processing condition is associated with the physical quantity, and
- the processing condition includes at least one of electrode bias power that produces the electric field distribution, a flux amount of a particle within the chamber, or a flux vector of the particle within the chamber;

processing, by a processing unit, the sample based on the processing condition;
changing the processing condition based on the predicted physical quantity; and
supplying the changed processing condition to the processing unit as a new processing condition.

* * * * *